(12) United States Patent
Patapoutian et al.

(10) Patent No.: US 6,184,806 B1
(45) Date of Patent: Feb. 6, 2001

(54) RATE 32/33 (D=0, K=6) RUN LENGTH LIMITED MODULATION CODE HAVING OPTIMIZED ERROR PROPAGATION

(75) Inventors: Ara Patapoutian, Westborough; Jennifer Stander, Boylston, both of MA (US); Peter McEwen; Bahjat Zafer, both of Santa Clara, CA (US); James Fitzpatrick, Los Altos, CA (US)

(73) Assignee: Quantum Corporation, Milpitas, CA (US)

( * ) Notice: Under 35 U.S.C. 154(b), the term of this patent shall be extended for 0 days.

(21) Appl. No.: 09/042,243

(22) Filed: Mar. 13, 1998

(51) Int. Cl.$^7$ ............................... H03M 7/00; H03M 5/00
(52) U.S. Cl. ................................. 341/59; 341/58
(58) Field of Search ..................... 341/59, 53, 58, 341/57, 107; 714/786; 369/59

(56) References Cited

U.S. PATENT DOCUMENTS 5,635,933  6/1997  Fitzpatrick et al. ............... 341/58
6,018,304  * 1/2000  Bessios ........................... 341/58

OTHER PUBLICATIONS

Wijngaarden and Immink, "Combinatorial Construction of High Rate Runlength–limited Codes" *IEEE Proc. Globcom,* 1996, pp. 343–347.

Wijngaarden and Immink, "On the Construction of Constrained Codes employing Sequence Replacement Techniques". *ISIT 1997,* Ulm, Germany, Jun. 29–Jul. 4, p. 144.

* cited by examiner

*Primary Examiner*—Patrick Wamsley

(57) ABSTRACT

A method and apparatus for encoding a sequence of 32 bit digital data words into a sequence of 33 bit code words in consonance with predetermined minimum zero run length (d) and predetermined maximum zero run length (k) for recording upon a magnetic medium within a magnetic recording channel is disclosed. The method comprises steps of dividing each data word into eight data nibbles, determining whether any data nibble contains all zeros. If no code violation, mapping the eight data nibbles to seven code nibbles and to four bits of a five bit code sub-word and setting a fifth control bit to one. If one or more code violations are present, embedding code violation locations within at least the five bit code sub-word and other code nibbles if necessary and remapping data nibbles ordinarily directed to the code sub-word and nibble locations to code locations otherwise containing the data nibbles determined to be code violations.

21 Claims, 6 Drawing Sheets

| u7 | u6 | u5 | u4 | u3 | u2 | u1 | u0 |
|---|---|---|---|---|---|---|---|
| U[31:28] | U[27:24] | U[23:20] | U[19:16] | U[15:12] | U[11:8] | U[7:4] | U[3:0] |

Fig. 2

| c7 | c6 | c5 | c4 | c3 | c2 | c1 | c0 |
|---|---|---|---|---|---|---|---|
| C[32:29] | C[28:25] | C[24:20] | C[19:16] | C[15:12] | C[11:8] | C[7:4] | C[3:0] |

Fig. 3

| # of Violations | Indicator Bits | | | Encoding Rules |
|---|---|---|---|---|
| | c5[0] | c5[2] | c4[3] | |
| 0 | 1 | X | X | c7=u7, c6=u6, c5=(u5 1), c4=u4, c3=u3, c2=u2, c1=u1, c0=u0. |
| 1 | 0 | 1 | X | The bits c5[4:3,1] indicate the violation nibble. The user bits in u5 are mapped to the code nibble indicated by c5[4:3,1]. The other nibbles are mapped, c7=u7, c6=u6, etc. |
| 2 | 0 | 0 | 1 | The three bits c5[4:3,1] indicate the left violation nibble and the bits c4[2:0] indicate the position of the right violation. The user bits of u5 and u4 are mapped into the code nibbles indicated by c5[4:3,1] and c4 [2:0]. Remaining nibbles are mapped c7=u7, c6=u6, etc. |
| 3 or more | 0 | 0 | 0 | The eight bits (c5[4:3] c4[2:0] c3[2:0]) are set equal to the 8 flag bits. Bits c5[1] and c3[3] are set equal to 1. Code nibbles are assigned to their corresponding nonzero user nibbles when possible (i.e. c7=u7, etc). When there are 4 or more violations extra code nibbles are padded with all ones to maximize timing information for the clock recovery. User nibbles u3, u4, and u5 are assigned to nibbles known to have been all zeros. |

*Fig. 4*

| # of Violations in 32 bit user word U | Probability of Occurrence | Percent of Occurrences |
|---|---|---|
| 0 | .597 | 59.7% |
| 1 | .318 | 31.8% |
| 2 | .074 | 7.4% |
| 3 | 9.9e-3 | 1.1% |
| 4 | 8.25e-4 | |
| 5 | 4.4e-5 | |
| 6 | 1.5e-6 | |
| 7 | 2.8e-8 | |
| 8 | 2.3e-10 | |

*Fig. 5*

| k | Pr(1) - before precoding | Pr(Slope Lookup Entry) | Max. Code Rate Possible |
|---|---|---|---|
| 3 | .566 | .624 | .947 |
| 4 | .538 | .599 | .975 |
| 5 | .522 | .584 | .988 |
| 6 | .512 | .575 | .994 |
| 7 | .507 | .570 | .997 |
| 8 | .504 | .567 | .999 |
| 9 | .502 | .565 | .999 |
| 10 | .501 | .564 | .999+ |
| Infinity | .5000 | .5625 | 1.000 |

*Fig. 6*

RATE 32/33 (D=0, K=6) RUN LENGTH LIMITED MODULATION CODE HAVING OPTIMIZED ERROR PROPAGATION

SUMMARY OF THE INVENTION

The present invention relates to modulation codes, methods and modulation encoding/decoding apparatus. More particularly, the present invention relates to a high rate run length limited modulation code with a small maximum run length (e.g. k=6), with optimized error propagation properties and with a simple implementation within a magnetic recording system, such as a digital linear magnetic tape recording and playback system.

BACKGROUND OF THE INVENTION

Modulation codes have been employed within magnetic recording channels in order to achieve a more even distribution of magnetic flux transitions within a data track in view of data patterns of particular user information being encoded and recorded. In particular, run length limited (RLL) modulation codes have been employed within partial response, maximum likelihood sampling detection (PRML) data recording and playback channels, decision feedback equalization (DFE) detection channels, and fixed delay tree search (FDTS) detection channels.

Canonical partial response targets of interest for magnetic data storage channels have included a (1−D) di-code target, a PR4 (1−$D^2$) target, an EPR4 (1+D−$D^2$−$D^3$) target and an $E^2$PR4 target, where D represents a unit delay operator. One drawback of a canonical target of form (1−D)(1+D)$^N$ is that it is only an approximate match to the magnetic channel but is relatively easily implemented; and it manifests a spectral null at the Nyquist sampling frequency. Other targets useful in magnetic recording channels include minimum mean square error (MMSE) type targets. A new class of fixed partial response targets is described in a pending patent application by Fisher et al, U.S. Ser. No. 09/034,933, filed on Mar. 4, 1998, entitled: "Disk Drive Using New Class of Fixed Partial Response Targets in a PRML Sampled Data Detection Channel", the disclosure thereof being hereby incorporated by reference.

In PRML sampling data detection systems Viterbi detectors are conventionally employed to achieve "maximum likelihood" detection of user data being played back from a magnetic recording medium. For example, a Viterbi detector having an eight state trellis (nominal EPR4 target) generally employs an iterative method in determining a maximum likelihood path or route along the various branches of the detector trellis. "Maximum likelihood" generally means a particular path through the trellis creating a minimum mean square error.

A modulation code for a PRML data recording and playback channel is selected to impose certain desired signal playback conditions desired or needed to achieve robust and reliable data sampling and to limit the span of information corrupted by errors in the recording/playback process, at the expense of some additional overhead information added to the coded data stream. The amount of additional overhead information directly relates to the "rate" or efficiency of the modulation code. The less overhead information added by the modulation code, the higher the rate or efficiency of the code. As efficiency increases less recording space is consumed by overhead information needed by the modulation code.

The "rate" of a particular modulation code is defined as the ratio of unencoded bits to encoded bits in the coded output data stream. For example, a rate 2/3 code would have two user bits translated into three code bits, and would have an efficiency of only 0.667 i.e., considered to be a low rate. A rate 8/9 modulation code would have a higher efficiency of 0.889. The rate is said to increase as the efficiency approaches unity, and modulation codes having efficiencies in excess of 0.889 are called "high rate" codes.

A rate 16/17 (=0.941) modulation code achieves an approximate six percent (6%) increase in recording density over a standard rate 8/9 modulation code. The increased rate realized with a rate 16/17 modulation code means that each code bit recorded on the magnetic recording medium (disk or tape) contains approximately 6% more user data information than contained within a similar code bit in accordance with a rate 8/9 modulation code. One example of a rate 16/17 modulation code is provided in commonly assigned U.S. Pat. No. 5,635,933 to Fitzpatrick, et al., entitled: "Rate 16/17 (D=0, G=6/I=7) Modulation Code for a Magnetic Recording Channel", the disclosure thereof being incorporated herein by reference. Another example of a rate 16/17 modulation code is provided by U.S. Pat. No. 5,757,822, by Fisher et al., entitled: Bit-Interleaved Rate 16/17 Modulation Code with Three-Way Byte-Interleaved EC", the disclosure thereof being incorporated herein by reference.

An example of a rate 24/25 modulation code is provided by U.S. Pat. No. 5,737,294, by Fisher et al., entitled: "Rate 24/25 Modulation Code for PRML Recording Channels", the disclosure thereof being incorporated herein by reference. An article by Wijngaarden and Immink entitled: "Combinatorial Construction of High Rate Runlength-limited Codes", *IEEE Proceedings of Globecom* 1996, pages 343–347, describes techniques for constructing high rate modulation codes. In the paper the authors described examples including a rate 16/17 (d=0,k=4) code and a rate 16/17 (d=0,k=6) code. One difficulty arising from the adoption of a very high rate modulation code is the considerable complexity usually required to realize practical hardware implementations of the encoding and decoding processes.

Added complexities are presented in the instance of multi-channel linear digital magnetic tape recording. Tape recording differs from rigid disk recording in that moving recording tape has relatively very low mass and is susceptible to substantial variation in instantaneous tape velocity. On the other hand, one or more rigid recording disks mounted to a rotating spindle manifest substantial angular momentum which impedes instantaneous change in angular velocity.

A number of circumstances have been found to contribute to tape velocity differentials. Eccentric spooling of the tape onto the supply or take up reel can result in repeatable velocity variations as the tape is fed from its eccentrically mounted spool or pancake. Defects in reels or other elements of the tape guide path can also contribute to tape differential velocity. Further, tape that has been spooled in e.g. a relatively dry or humidity-free environment and later stored for a time in a high humidity environment may experience constrained expansion from absorption of moisture, leading to unpredictable behavior causing sharp velocity differentials as the tape is fed from the spool.

One consequence of the variation in tape velocity is that the frequency of the recorded data becomes modulated by the velocity changes. In detecting the bits recorded on a tape, a phase locked loop is used to track any frequency variations, thus enabling reliable detection of bits recorded at very high recording densities as is commonly employed within PRML sampling data detection channels. To ensure that the phase locked loop works satisfactorily it is important to provide frequent phase error information. As considered at an input to a write preamplifier (output of precoder) a one corresponds to one polarity of write current, e.g. positive, and a zero corresponds to an opposite polarity of write current, e.g. negative. Whenever a one follows a zero, or a zero follows a one, a reversal of magnetization is written to the magnetic media, and a bell-shaped pulse approximately shaped like a Lorentzian function results in the sensed waveform during playback. In order to provide frequent timing and gain information needed during playback, long runs of no magnetic flux transitions, and long runs of consecutive magnetic flux transitions, are to be avoided. This objective is conventionally accomplished by run length limiting the bits at the input to a $1/(1+D^2)$ precoder, where D is a unit delay operator.

In a modulation code for a PRML sampling magnetic tape recording channel, for example, it is desirable that a maximum run length constraint be sized in order to provide acceptable timing information to assure reasonably accurate sampling of the recorded waveform during playback. The maximum number of consecutive zero bits permitted by the modulation code is referred to as the "k" constraint, while the minimum number of zero bits between one bits permitted by the code is referred to as the "d" constraint.

Information written onto a track of a magnetic tape is first modulation encoded before recording. In the detection process the analog playback signal is converted into modulation coded bits using the Viterbi detector process described above (or a similar device such as a decision feedback equalizer or a fixed delay tree search detector). The coded bits are decoded into information bits by passing through a modulation decoder. When errors occur in the detection process they can be further propagated into more errors in passing through the modulation decoder. One desired characteristic of a modulation code is that it limit or restrict the propagation of errors as much as possible. Limiting error propagation to a small amount of the recorded information desirably aids subsequent block error correction processes which are typically applied at the drive system level.

Magnetic storage systems typically include block memories and embedded control microprocessors. Currently, block memory arrays and control microprocessors used to handle data transfers within data storage systems are based upon 32 or 64 bit width bus architecture. As a consequence, the memory array's and the microprocessor's basic unit of data (data word) is 32 (or 64) bits. It is therefore desirable to provide a high rate modulation code which is congruent with the bus width of the block memory array and the control microprocessor in order to limit the complexity of circuitry interfacing the recording channel to the block memory and to the control microprocessor.

Therefore, a hitherto unsolved need has remained for a very high rate modulation code for a magnetic recording channel which meets the foregoing requirements and solves the problems associated with the prior approaches.

SUMMARY OF THE INVENTION WITH OBJECTS

A general object of the present invention is to provide a rate 32/33 (d=0, k=6) run length limited modulation code having optimized error propagation for use in a magnetic recording channel in a manner and form overcoming limitations and drawbacks of the prior art.

Another object of the present invention is to provide a practical rate 32/33 modulation code and implementation which achieves a very high code rate without sacrificing reliability of detected data in a manner overcoming limitations of prior approaches.

A further object of the present invention is to provide simplified, reliable encoding and decoding methods for encoding 32 bit data words into 33 bit code words in consonance with predetermined modulation coding constraints, including minimum zero run length, and maximum zero run length and in a manner effectively limiting error propagation.

In accordance with principles and aspects of the present invention a method is provided for generating a (d=0, k=6) rate 32/33 channel code for use in a partial response, sampling data detection channnel, such as a multi-channel linear digital magnetic tape recording/playback channel, to encode a series of user digital data bits. The method most preferably comprises the steps of:

forming a sequence of 32-bit user data words, dividing each 32-bit user data word into eight four-bit data nibbles, determining whether any of the data nibbles contain all zeros, if no data nibbles are found to contain all zeros, then mapping the eight four-bit data nibbles to seven four-bit code nibbles and one five-bit code sub-word, and setting a first control bit of the code sub-word, comprising a fifth bit position thereof, to one, or if a single data nibble is determined to contain all zeros as a code violation, then embedding location of the code violation within at least the five-bit code sub-word, and mapping a data nibble otherwise mapping to the five-bit code sub-word to a code nibble otherwise receiving the data nibble determined to have a code violation, or if two data nibbles are determined to contain all zeros, then setting the first control bit to zero, setting a second control bit of the code sub-word to zero, and setting a third control bit within a second code sub-word to one, setting the remaining three bits of the first code sub-word to identify one of the two data nibbles containing all zeros within a first predetermined range of data nibbles, and setting the remaining three bits of the second code sub-word to identify the other of the two data nibbles containing all zeros within a second predetermined range of data nibbles, relocating a data nibble otherwise mapping to the first code sub-word to a code sub-word otherwise receiving the data nibble identified by the first code sub-word to contain all zeros, and relocating a data nibble otherwise mapping to the second code sub-word to a code sub-word otherwise receiving the data nibble identified by the second code sub-word to contain all zeros, or if three or more data nibbles are determined to contain all zeros, then generating an eight-bit flag wherein each bit position of the flag identifies a data nibble determined to contain all zeros, and writing the eight bit flag into predetermined control bit positions defined in the first code sub-word, the second code-sub word, and a third code sub-word. This step may also include the step of writing a fourth code sub-word to all ones to provide maximum timing information for a timing loop of the magnetic recording channel.

A modulation encoder, and a modulation decoder, operating in consonance with the described modulation encoding method also form a part of the present invention.

These and other objects, advantages, aspects and features of the present invention will be more fully understood and appreciated upon consideration of the following detailed description of a preferred embodiment, presented in conjunction with the accompanying drawings.

BRIEF DESCRIPTION OF THE DRAWINGS

In the Drawings:

FIG. 2 is a table associating user bits to nibbles in accordance with principles of the present invention.

FIG. 3 is a table associating code bits to nibbles in accordance with principles of the present invention.

FIG. 4 is a table summarizing the four coding rules in accordance with the present invention.

FIG. 5 is a table summarizing probability that a 32 bit user word at the modulation encoder of FIG. 1 contains k violations.

FIG. 6 is a table of statistics of maxentropic (0,k) constrained sequences.

DETAILED DESCRIPTION OF A PREFERRED EMBODIMENT

Figure 1:
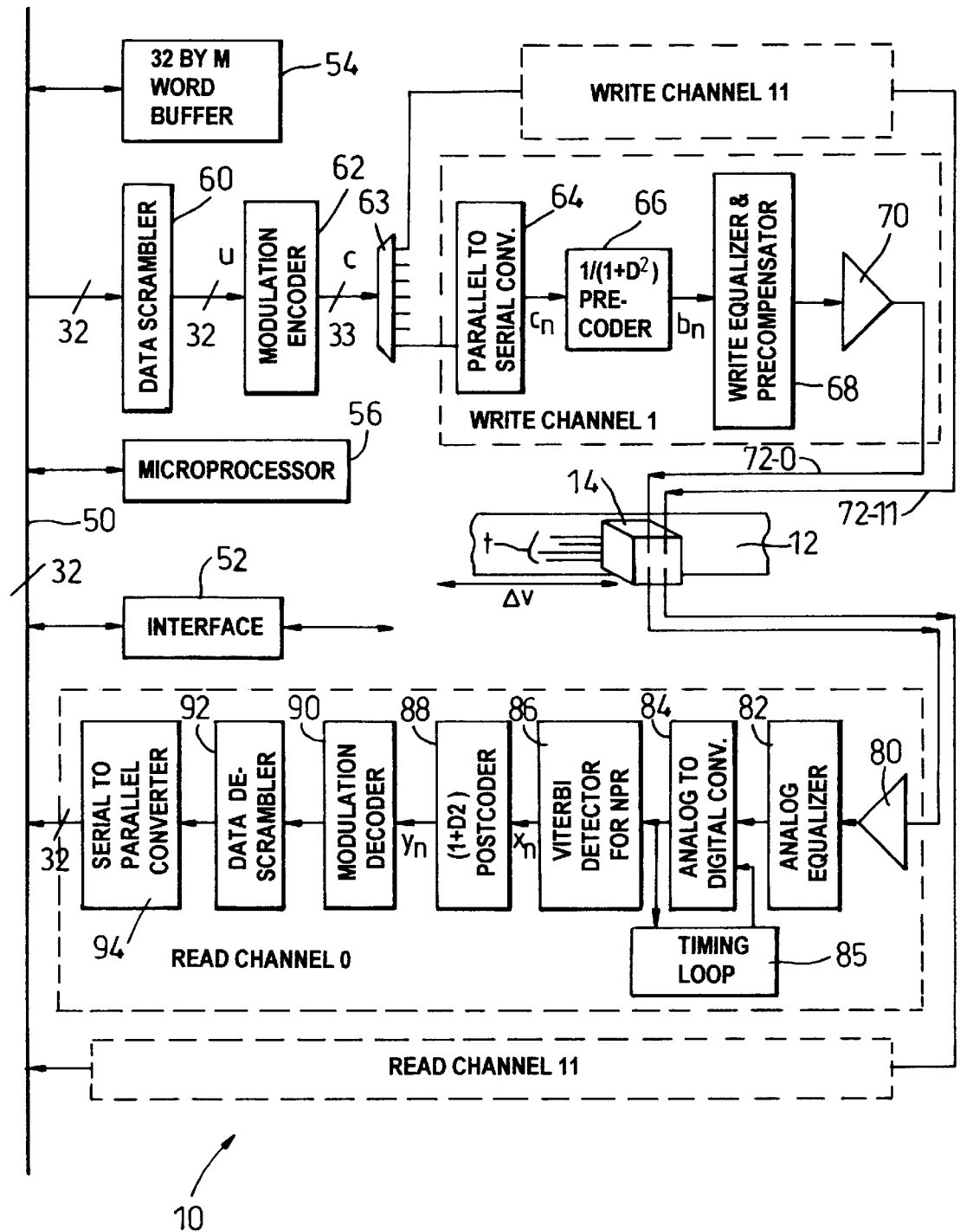
FIG. 1 is a block diagram of a magnetic data storage device, such as a multi-channel digital linear tape drive, employing partial response sampling data detection and a channel modulation code in accordance with aspects and features of the present invention.

As noted above one purpose of a modulation code is to ensure that user information recorded on a magnetic storage medium, such as a tape moving linearly across a non-moving recording head structure, is optimized for the detection process. A relevant portion of a tape recording and playback system 10 is shown in FIG. 1. Therein, a multi-channel linear tape recording system 10 simultaneously writes and check reads a plurality of parallel magnetic recording tracks t formed on a relatively moving magnetic recording tape 12, such as one-half inch magnetic recording tape having desired magnetic remanence and coercivity properties enabling high density digital magnetic recording and playback. A multi-channel magnetic recording head structure 14 may follow one of a variety of useful implementations. In one exemplary arrangement the recording head structure 14 may include e.g. at least 24 magnetic write elements and 24 magnetic read elements are arranged alternately in two transverse rows such that twelve write elements are followed by twelve read elements during both forward and reverse travel of the tape across the head structure 14. In an alternative arrangement twelve write elements may be provided on one side of twelve centrally located read elements, and twelve write elements may be provided on the other side of the read elements such that twelve data tracks may be simultaneously written and write-checked during movement of the tape across the head structure 14 in both forward and reverse directions. In a further alternative arrangement, twelve read elements may be provided on one side of twelve centrally located write elements, and twelve read elements may be provided on the other side of the write elements such that twelve data tracks may be simultaneously written and read during forward and reverse tape travel. A bidirectional arrow in FIG. 1 denotes bidirectional travel of the tape 12, and the $\Delta v$ symbol adjacent thereto denotes the presence of undesired differential tape velocity caused by one or a number of influences discussed hereinabove.

An internal system bus 50 interconnects an interface structure 52 and a block buffer memory 54. An embedded control microprocessor 56 controls various functions of the tape system 10 including tape transport and lateral head positioning functions (not further described herein). The microprocessor 56 also controls the flow of user information to and from the interface 52 and buffer memory 54. While a single microprocessor 56 is shown in FIG. 1, those skilled in the art will appreciate that the control functions of system 10 may be distributed among several embedded microprocessors or digital signal processors, etc. The bus 50 has a predetermined word size, such as 32 or 64 bits bus width. Presently, 32-bit width is preferred, and the interface 52, buffer memory 54 and microprocessor 56 are designed to match the bus bit width (e.g. 32-bit) thereby minimizing the complexity of any internal bus interface or "glue" logic.

A write portion of the system 10 includes a data scrambler 60 which receives e.g. 32-bit words from the bus 50 and scrambles the words in accordance with a predetermined conventional scrambling algorithm such as modulo two. In this manner repetitive or constant bit patterns frequently found to complete or fill user data blocks or repetitive command patterns will be avoided in the resultant bit stream leaving the scrambler. While it is theoretically possible for a user data pattern to be scrambled into a periodic sequence, the likelihood that such a pattern would extend for more than N bits is approximately $2^{(-N)}$.

A parallel data word output from the scrambler 60 leads through a modulation encoder 62. The modulation encoder 62 imposes a modulation code upon the scrambled data words coming in from the data scrambler 60. The modulation encoder 62 converts incoming 32-bit scrambled user data bit words into 33-bit code words in accordance with principles of the present invention. Implementation details of the modulation encoder 62 are given hereinafter. The 33-bit code words are then selectively directed to each one of 12 parallel write channel paths. Channel zero is shown at the block implementation level, and channel 11 is shown in block outline in FIG. 1. It should therefore be understood that channels 0–11 are substantially identical. A selector 63 directs each 33-bit code word from the modulation encoder 62 to one of the 12 write channels 0–11, in accordance with a predetermined data recording pattern for the tracks t. In this manner only one modulation encoder 62 need be implemented for all of the write channels 0–11.

Each write channel path includes e.g. a parallel-to-serial converter 64 which puts out each received 33-bit code word as a serial stream of 33 sequential bits $c_n$. This bit stream then passes through a suitable precoder 66. If the bit sequences $\{c_n\}$ and $\{b_n\}$ are respective input and output bit sequences of the precoder 66, then the Output of the precoder 66 at time n can be expressed as $b_n = XOR(b_{n-2}, c_n)$. While the precoder 66 simplifies the design of modulation codes that are both DC and high frequency constrained, the precoder 66 has the negative impact of lengthening the longest recorded magnets on the tape to k+2 bits. The modulation coded and precoded serial bit stream $b_n$ is then passed through a conventional write equalization and write precompensation process 68 and then amplified by a write driver 70 into a digital write current before being applied over a path 72-0 to one of the twelve write elements of the head structure 14. In the FIG. I example write head select circuitry has been omitted but would be included in a practical implementation having two write heads per track, the circuitry to select a particular write element for each recording direction.

As shown in FIG. 1 there are 12 identical read channels, each connected to a read element of the head structure 14.

Read channel zero is shown in block level detail, and the other 11 channels are symbolized by the single dashed-line block labeled "Read Channel 11" in FIG. 1. In each read channel, a gain-controlled amplifier 80 and an analog equalizer 82 normalize the gain and response of the analog read back signal to the preferred PRML target, and an analog to digital converter 84 then samples the analog signal in accordance with the target. A timing loop 85 derives timing clock information from the samples and thereby controls the sampling of the analog to digital converter 84. A Viterbi detector 86 decodes the quantized samples into coded values $x_n$. Preferably, the Viterbi detector 86 implements an NPR target as one of the classes of PRML targets described in the referenced, pending U.S. patent application Ser. No. 09/034,933.

A postcoder 88 receives and postcode processes the coded values $x_n$ into values $y_n$. The output of postcoder 88 $\{y_n\}$ can be written in terms of the postcoder input $\{x_n\}$ as $y_n = \text{XOR}(x_n, x_{n-2})$. The postcoded samples $y_n$ are then passed through a modulation decoder 90. The modulation decoder 90 applies an inverse function of the function applied by the modulation encoder and therefore is within the principles and aspects of the present invention. The decoded serial data stream is then passed through a conventional data descrambler 92 also operating as an inverse of the scrambling function applied by the data scrambler 60. A serial-to-parallel converter 94 accumulates the serial bit stream into 32-bit words and passes the words onto the data bus 50 e.g. for temporary storage in the buffer 54. A block error correction process may be applied to each block of the recovered user data information in order to detect and correct any error bursts. The block error correction process is conventional and is not a part of the present invention and is therefore not described in any detail.

Figure 1A:
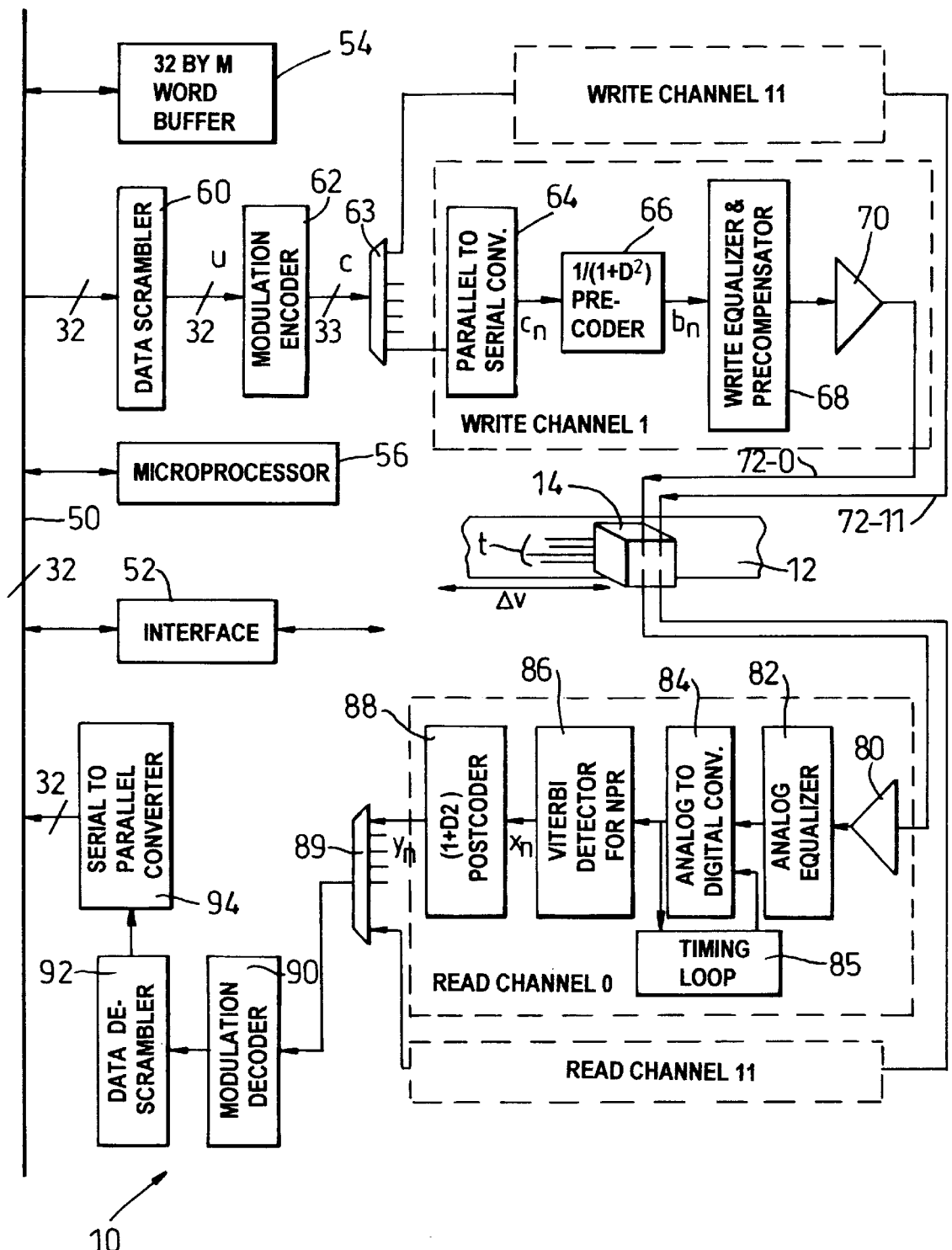
FIG. 1A is a block diagram comprising a slight architectural variant of the magnetic data storage device shown in FIG. 1.

FIG. 1A sets forth an alternative read channel architecture in which 12 identical read channels have outputs from postcoders 88 feeding directly into a multiplexer 89. The multiplexer 89 has a single output which feeds into a single modulation decoder 90. A single data descrambler 92 and serial-to-parallel converter 94 complete this alternative architecture. In this alternative embodiment only one modulation decoder need be implemented, with some savings of gates in VLSI read channel implementations. In yet another alternative embodiment, a single VLSI chip contains four read channels feeding into a single multiplexed modulation decoder. Further multiplexing circuitry enables three of these four-channel chips to form a 12 channel implementation.

It has been found particularly advantageous to match the word width of the modulation encoder 62 and the modulation decoder 90 to the word width of bus 50, microprocessor 56 and block buffer 54. In one design considered during a development leading to the present invention a rate 24/25 code was proposed for a 12 head multi-channel tape drive architecture. That approach, in which a single 24 bit encoder was used for 12 heads required approximately ten thousand gates more than were required in the encoder implementations of FIGS. 1 and 1A.

Encoding and Decoding

Unconstrained user data is received in user data words of 32 bits and is encoded into code words of 33 bits. With reference to the FIG. 2 table, each unencoded 32-bit data word is defined as U, and a corresponding 33-bit code word is defined as C. The 32 user bits are parsed into eight four-bit nibbles that are named u7, u6, u5, u4, u3, u2, u1, and u0. As shown in the FIG. 3 table, the user nibbles are encoded into coded nibbles c7, c6, c5, c4, c3, c2, c1, and c0. It is important to note in this example that the code sub-word c5 comprises five bits, while all of the other code nibbles comprise four bits each. In this example an additional, fifth bit position of code sub-word c5, e.g. a least-significant-bit c5[0], forms a control bit.

Each user nibble u7, u6, . . . u0 is said to have a code violation if it is equal to "0000". An eight bit variable, FLAG, is created. The nth bit of FLAG is set equal to one if a nibble un is equal to all zeros. For example, if U=(u7 u6 u5 u4 u3 u2 u0)=(0000 1000 0110 0000 1111 0010 0000 0111), then FLAG=(10010010), meaning that code violations are present at user nibbles u7, u4 and u1.

Encoding of the 32-bit user data word is carried out in accordance with the following four rules, depending upon the number of violations found to be present in the word U presently to be encoded. The FIG. 3 table summarizes the four coding rules. The following cases illustrate each of the four rules.

Case 1: No violations in U (59% likelihood of occurrence (upon the assumption that ones and zeros are equally likely to occur at the input to the modulation encoder)). The FLAG variable is set equal to 00000000. The control bit of code sub-word c5, i.e. c5[0], is set equal to one and the remaining nibbles are passed unencoded. Thus, c7 equals u7, c6 equals u6, c5[5-1] equals u5, c4 equals u4, c3 equals u3, c2 equals u2, c1 equals u1 and c0 equals u0.

Case 2: One violation in U (31.8% likelihood of occurrence). The FLAG variable is set equal to one of {00000001, 00000010, 00000100, . . . 10000000 } depending upon the location of the nibble containing the code violation. The bits c5[0] and c5[2] are set to be equal to zero and one respectively. The remaining c5 bits are used to indicate in which of the eight locations the single violation occurred. For example, if FLAG indicates that the third low order nibble u2 contained the single code violation (FLAG= 00000100), then c5[0]=0, c5[2]=1, and c5[4:3, 1]=010 to indicate that the third nibble u2 contains four zeros. Since the nibble c5 is used to indicate in this example that the nibble u2 is all zeros, the information in user nibble u5 is mapped into the third code nibble position c2. Encoding is completed as c7 equals u7, c6 equals u6, c5 equals [01110], c4 equals u4, c3 equals u3, c2 equals u5, c1 equals u1 and c0 equals u0.

Case 3: Two violations in U (7.4% likelihood of occurrence). The FLAG variable has two bit positions set, e.g. {00000011, 00000101, . . . 11000000}. The bits c5[0] and c5[2] are set to zero, and the bit c4[3] is set to one. The remaining c5 bit positions are used to indicate in which of the eight locations the left side violation occurred, and the bits c4[2:0] indicate the nibble position of the right side violation. For example, if violations occurred in nibbles u7 and u0, FLAG is equal to 10000001, and c5[0] equals zero, c5[2] equals zero, c4[3] equals 1, c5[4:3,1] equals 111 and c4[2:0] equals 000. Since the user nibble u7 is all zeros, the nibble c5 is used to indicate that nibble u7 is all zeros, and the information in nibble u5 is mapped into c7 (i.e. the 8th code nibble). Similarly, the information in user nibble u4 is mapped into c0 (the first code nibble). The final encoding of this example is therefore c7 is equal to u5, c6 is equal to u6, c5 is equal to [01100], c4 is equal to [1000], c3 is equal to u3, c2 is equal to u2, c1 is equal to u1 and c0 is equal to u4. In this example, the mapping of u5 to c7, u4 to c0 and u3 to c3 is carried out in a manner to minimize gate count of the modulation encoder 62.

Case 4: Three or more violations in U (1.1% likelihood of occurrence). The control bits c5[0], c5[2] and c4[3] are all set equal to zero. The bits c5[4:3], c4[2:0] and c3[2:0] are set equal to the eight flag bits. Bits c5[1] and c3[3] are both filled with ones to ensure that the k constraint (k=6) is satisfied. As an example, four code violations are found to occur at nibbles u7, u6, u4, and u3 (FLAG=1011000). The encoded 33-bit word becomes c7 equal to u5, c6 equal to all ones, c5 equal to [11010], c4 equal to [0011], c3 equal to [1000], c2 equal to u2, c1 equal to u1 and c0 equal to u0. Note that c6 has been set to all ones to provide maximum timing information for the timing loop 85.

The decoding process carried out by modulation decoder 90 comprises the step of examining bits c5[0], c5[2] and c4[3] in order to determine the number of original nibbles that contained violations detected in the encoding process. For example, if c5[0] equals zero, c5[2] equals one and c4[3] equals zero, only a single nibble was in violation in the encoding process and that bits c5{4:3,1] identify the code nibble to be set to all zeros during decoding. Additionally, the nibble location indicated by c5[4:3,1] is mapped onto the u5 code nibble.

The logic of modulation encoder 62 and modulation decoder 90 was developed with the aid of Verilog and Synthesis circuit design tools. FIG. 5 sets forth a listing in Verilog of logic equations implementing the encoder 62, and FIG. 6 sets forth a listing in Verilog of logic equations implementing the decoder 90. As implemented the encoder 62 requires approximately 415 gates and the decoder 90 requires approximately 325 gates.

Error Propagation

When the Viterbi detector 86 makes an incorrect decoding decision, bad information is passed into the postcoder 88. As already noted above, operation of the postcoder 88 lengthens the error event by two additional bits. Errors going into the modulation decoder 90 result in errors in the decoded user bit stream leaving the decoder 90. Generally speaking, more errors result at the output of the modulation decoder 90 than were present at its input. This multiplication of error sizes is referred to herein as error propagation. The presently preferred code described herein has limited error propagation.

The nature of error propagation for the (0,6) rate 32/33 code depends upon the probability that the erroneous bits include control bits c5[0], c5[2] or c4[3], and whether the control bits are being used in the decoding of the word of present interest. If the erroneous code bits do not impact code nibbles c3, c4 or c5, then the number of errors at the output of the decoder 90 does not multiply. However, if bit c5[0] is in error, it is very likely that most of the 32 decoded bits will be in error. The probability of bit c5[0] being in error is a function of the errors entering the decoder 90. The probability that a five bit error affects bit c5[0] is approximately 5/33. The table set forth as FIG. 5 shows the probability that bits at the input of the encoder 62 will contain 0, 1, 2, . . . or 8 violated nibbles. This probability indirectly relates to error propagation in the sense that the likelihood that corrupted bits effect the control bits depends upon which bits are control bits. The table of FIG. 5 shows the likelihood that the encoder 62 will have to encode with a case 1, case 2, case 3, or case 4 type violation. Because all of the control bits of the preferred embodiment are located toward the center of the coded word, errors that straddle word boundaries do not further propagate into longer bursts at the output of the decoder 90. However, in some cases the code nibble c7 is mapped as far away as user nibble u3. Therefore, it is possible for an error which straddles two 33-bit code words to result in two errors separated by two uncontaminated bytes.

The k Constraint and Statistical Properties

To be certain that the k constraint of the presently preferred code is six, the four different categories of encoding discussed above and summarized in the FIG. 3 table must be considered. If each of the eight nibbles u0, u1, . . ., u7 contains at least a single one, and c5[0] is equal to one, then the maximum run of zeros arises when the nibble having a bit value of 1000 is immediately followed by a nibble having a value of 0001 In this example the k=6 constraint is satisfied. When a single violation is found in a user nibble, then c5[2] is set equal to one, and all other nibbles are ensured to contain at least a one; and, in this case the k=6 constraint is also satisfied.

When two violations are present in a user word of interest, then c5[2]=c5[0]=0, and c5[4:3,1] is used to indicate the position of the left most nibble in violation. Consequently, there are two situations to consider. In a first situation the left violation is in location 001, i.e. nibble u1. In this first situation c5=[00010] and the k=6 constraint is met. In the second situation the left most violation is in position 100, i.e. nibble u4, and c5=[10000], yet c4[3] is equal to one and the k=6 constraint is also met.

Finally, consider the situation where there are three or more code violations in the user word U of present interest at the input to encoder 62. In this situation c5[1] is equal to one, and c3[3] is equal to one, which ensures that even if c4 is all zeros, the k=6 constraint is not violated.

The statistical data presented in the table of FIG. 6 has been calculated in order better to understand the value of the k constraint on the timing loop 85 of the read channel. In FIG. 6 some statistical properties of (0,k) constrained sequences were calculated as a function of values of k from 3 through 10 and k equal to infinity (no maximum zero run length constraint). The calculations underlying the data of FIG. 6 do not specifically use the coding rules of the presently preferred code described herein, but rather rely on the statistical properties of generic (i.e. maxentropic) (0,k) constrained sequences, see T. D. Howell, "Statistical Properties of Selected Recording Codes", *IBM Journal of Research and Development,* Vol. 33, No. 1, January 1989, pp. 60–73. The values of the second column of the FIG. 6 table indicate the likelihood that an arbitrarily selected bit is equal to one (as opposed to a zero). The values of the third column of the FIG. 6 table represent the probability that any given bit will provide timing information to the phase locked loop of the timing circuit 85. The FIG. 6 fourth column values indicates a bound on the code rate possible for each k constraint.

It is interesting to note that the k constraint does not significantly influence the statistical properties of the data (assuming equally likely ones and zeros at the input of encoder 62). If a larger k constraint were considered allowable, it is easy to extend the presently preferred rate 32/33 code to higher rates by padding unencoded bits between code nibbles c0, c1, . . ., c7. One specific case of value results from padding four unencoded bits between each coded nibble to make a (0,10) 64/65 code, which is particularly well suited if the bus structure 50 had a bit width of 64 bits (and so with memory 54 and/or microprocessor 56), for example. In this latter example the error propagation properties are nearly identical to the presently preferred (0,6) 32/33 code and rate.

Encoder Implementation: The following is a listing in the Verilog language of logic definitions and equations implementing a modulation encoder in accordance with coding rules of the present invention.

```
timescale 1ns/1ns
module enc3233k6_case_dummy (x0, x1, x2, x3, x4, x5, x6, x7, c0 , c1, c2, c3,
c4, c5, c6, c7);
input [3:0] x0;
input [3:0] x1;
input [3:0] x2;
input [3:0] x3;
input [3:0] x4;
input [3:0] x5;
input [3:0] x6;
input [3:0] x7;
output [3:0] c0;
output [3:0] c1;
output [3:0] c2;
output [3:0] c3;
output [3:0] c4;
output [4:0] c5;
output [3:0] c6;
output [3:0] c7;
reg [3:0] c0;
reg [3:0] c1;
reg [3:0] c2;
reg [3:0] c3;
reg [3:0] c4;
reg [4:0] c5;
reg [3:0] c6;
reg [3:0] c7;
reg [7:0] flag;
wire [3:0] dd = 4'b1111;
always @ (x0 or x1 or x2 or x3 or x4 or x5 or x6 or x7)
begin
flag[7] = !(x7);
flag[6] = !(x6);
flag[5] = !(x5);
flag[4] = !(x4);
flag[3] = !(x3);
flag[2] = !(x2);
flag[1] = !(x1);
flag[0] = !(x0);
case (flag)
    8'b00000000 : begin c7 = x7; c6 = x6; c5 = {x5, 1'b1}; c4 = x4; c3 =
x3; c2 = x2;c1 = x1; c0 = x0; end
    8'b00000001 : begin c7 = x7; c6 = x6; c5 = 5'b00100; c4 = x4; c3 =
x3; c2 = x2; c1 = x1; c0 = x5; end
    8'b00000010 : begin c7 = x7; c6 = x6; c5 = 5'b00110; c4 = x4; c3 =
x3; c2 = x2; c1 = x5; c0 = x0; end
    8'b00000011 : begin c7 = x7; c6 = x6; c5 = 5'b00010; c4 = 4'b1000; c3 =
x3; c2 = x2; c1 = x5; c0 = x4; end
    8'b00000100 : begin c7 = x7; c6 = x6; c5 = 5'b01100; c4 = x4; c3 =
x3; c2 = x5; c1 = x1; c0 = x0; end
    8'b00000101 : begin c7 = x7; c6 = x6; c5 = 5'b01000; c4 = 4'b1000; c3 =
x3; c2 = x5; c1 = x1; c0 = x4; end
    8'b00000110 : begin c7 = x7; c6 = x6; c5 = 5'b01000; c4 = 4'b1001; c3 =
x3; c2 = x4; c1 = x5; c0 = x0; end
    8'b00000111 : begin c7 = x7; c6 = x6; c5 = 5'b00010; c4 = 4'b0000; c3 =
4'b1111; c2 = x3; c1 = x5; c0 = x4; end
    8'b00001000 : begin c7 = x7; c6 = x6; c5 = 5'b01110; c4 = x4; c3 =
x5; c2 = x2; c1 = x1; c0 = x0; end
    8'b00001001 : begin c7 = x7; c6 = x6; c5 = 5'b01010; c4 = 4'b1000; c3 =
x5; c2 = x2; c1 = x1; c0 = x4; end
    8'b00001010 : begin c7 = x7; c6 = x6; c5 = 5'b01010; c4 = 4'b1001; c3 =
x4; c2 = x2; c1 = x5; c0 = x0; end
    8'b00001011 : begin c7 = x7; c6 = x6; c5 = 5'b00010; c4 = 4'b0001; c3 =
4'b1011; c2 = x2; c1 = x5; c0 = x4; end
    8'b00001100 : begin c7 = x7; c6 = x6; c5 = 5'b01010; c4 = 4'b1010; c3 =
x4; c2 = x5; c1 = x1; c0 = x0; end
    8'b00001101 : begin c7 = x7; c6 = x6; c5 = 5'b00010; c4 = 4'b0001; c3 =
4'b1101; c2 = x5; c1 = x1; c0 = x4; end
    8'b00001110 : begin c7 = x7; c6 = x6; c5 = 5'b00010; c4 = 4'b0001; c3 =
4'b1110; c2 = x4; c1 = x5; c0 = x0; end
    8'b00001111 : begin c7 = x7; c6 = x6; c5 = 5'b00010; c4 = 4'b0001; c3 =
4'b1111; c2 = dd; c1 = x5; c0 = x4; end
    8'b00010000 : begin c7 = x7; c6 = x6; c5 = 5'b10100; c4 = x5; c3 =
x3; c2 = x2; c1 = x1; c0 = x0; end
    8'b00010001 : begin c7 = x7; c6 = x6; c5 = 5'b10000; c4 = 4'b1000; c3 =
x3; c2 = x2; c1 = x1; c0 = x5; end
    8'b00010010 : begin c7 = x7; c6 = x6; c5 = 5'b10000; c4 = 4'b1001; c3 =
x3; c2 = x2; c1 = x5; c0 = x0; end
    8'b00010011 : begin c7 = x7; c6 = x6; c5 = 5'b00010; c4 = 4'b0010; c3 =
```

```
      4'b1011; c2 = x2; c1 = x5; c0 = x3; end
    8'b00010100 : begin c7 = x7; c6 = x6; c5 = 5'b10000; c4 = 4'b1010; c3 =
x3; c2 = x5; c1 = x1; c0 = x0; end
    8'b00010101 : begin c7 = x7; c6 = x6; c5 = 5'b00010; c4 = 4'b0010; c3 =
4'b1101; c2 = x3; c1 = x1; c0 = x5; end
    8'b00010110 : begin c7 = x7; c6 = x6; c5 = 5'b00010; c4 = 4'b0010; c3 =
4'b1110; c2 = x3; c1 = x5; c0 = x0; end
    8'b00010111 : begin c7 = x7; c6 = x6; c5 = 5'b00010; c4 = 4'b0010; c3 =
4'b1111; c2 = x3; c1 = x5; c0 = dd; end
    8'b00011000 : begin c7 = x7; c6 = x6; c5 = 5'b10000; c4 = 4'b1011; c3 =
x5; c2 = x2; c1 = x1; c0 = x0; end
    8'b00011001 : begin c7 = x7; c6 = x6; c5 = 5'b00010; c4 = 4'b0011; c3 =
4'b1001; c2 = x2; c1 = x1; c0 = x5; end
    8'b00011010 : begin c7 = x7; c6 = x6; c5 = 5'b00010; c4 = 4'b0011; c3 =
4'b1010; c2 = x2; c1 = x5; c0 = x0; end
    8'b00011011 : begin c7 = x7; c6 = x6; c5 = 5'b00010; c4 = 4'b0011; c3 =
4'b1011; c2 = x2; c1 = x5; c0 = dd; end
    8'b00011100 : begin c7 = x7; c6 = x6; c5 = 5'b00010; c4 = 4'b0011; c3 =
4'b1100; c2 = x5; c1 = x1; c0 = x0; end
    8'b00011101 : begin c7 = x7; c6 = x6; c5 = 5'b00010; c4 = 4'b0011; c3 =
4'b1101; c2 = x5; c1 = x1; c0 = dd; end
    8'b00011110 : begin c7 = x7; c6 = x6; c5 = 5'b00010; c4 = 4'b0011; c3 =
4'b1110; c2 = dd; c1 = x5; c0 = x0; end
    8'b00011111 : begin c7 = x7; c6 = x6; c5 = 5'b00010; c4 = 4'b0011; c3 =
4'b1111; c2 = dd; c1 = x5; c0 = dd; end
    8'b00100000 : begin c7 = x7; c6 = x6; c5 = 5'b10110; c4 = x4; c3 =
x3; c2 = x2; c1 = x1; c0 = x0; end
    8'b00100001 : begin c7 = x7; c6 = x6; c5 = 5'b10010; c4 = 4'b1000; c3 =
x3; c2 = x2; c1 = x1; c0 = x4; end
    8'b00100010 : begin c7 = x7; c6 = x6; c5 = 5'b10010; c4 = 4'b1001; c3 =
x3; c2 = x2; c1 = x4; c0 = x0; end
    8'b00100011 : begin c7 = x7; c6 = x6; c5 = 5'b00010; c4 = 4'b0100; c3 =
4'b1011; c2 = x2; c1 = x3; c0 = x4; end
    8'b00100100 : begin c7 = x7; c6 = x6; c5 = 5'b10010; c4 = 4'b1010; c3 =
x3; c2 = x4; c1 = x1; c0 = x0; end
    8'b00100101 : begin c7 = x7; c6 = x6; c5 = 5'b00010; c4 = 4'b0100; c3 =
4'b1101; c2 = x3; c1 = x1; c0 = x4; end
    8'b00100110 : begin c7 = x7; c6 = x6; c5 = 5'b00010; c4 = 4'b0100; c3 =
4'b1110; c2 = x3; c1 = x4; c0 = x0; end
    8'b00100111 : begin c7 = x7; c6 = x6; c5 = 5'b00010; c4 = 4'b0100; c3 =
4'b1111; c2 = x3; c1 = dd; c0 = x4; end
    8'b00101000 : begin c7 = x7; c6 = x6; c5 = 5'b10010; c4 = 4'b1011; c3 =
x4; c2 = x2; c1 = x1; c0 = x0; end
    8'b00101001 : begin c7 = x7; c6 = x6; c5 = 5'b00010; c4 = 4'b0101; c3 =
4'b1001; c2 = x2; c1 = x1; c0 = x4; end
    8'b00101010 : begin c7 = x7; c6 = x6; c5 = 5'b00010; c4 = 4'b0101; c3 =
4'b1010; c2 = x2; c1 = x4; c0 = x0; end
    8'b00101011 : begin c7 = x7; c6 = x6; c5 = 5'b00010; c4 = 4'b0101; c3 =
4'b1011; c2 = x2; c1 = dd; c0 = x4; end
    8'b00101100 : begin c7 = x7; c6 = x6; c5 = 5'b00010; c4 = 4'b0101; c3 =
4'b1100; c2 = x4; c1 = x1; c0 = x0; end
    8'b00101101 : begin c7 = x7; c6 = x6; c5 = 5'b00010; c4 = 4'b0101; c3 =
4'b1101; c2 = dd; c1 = x1; c0 = x4; end
    8'b00101110 : begin c7 = x7; c6 = x6; c5 = 5'b00010; c4 = 4'b0101; c3 =
4'b1110; c2 = dd; c1 = x4; c0 = x0; end
    8'b00101111 : begin c7 = x7; c6 = x6; c5 = 5'b00010; c4 = 4'b0101; c3 =
4'b1111; c2 = dd; c1 = dd; c0 = x4; end
    8'b00110000 : begin c7 = x7; c6 = x6; c5 = 5'b10010; c4 = 4'b1100; c3 =
x3; c2 = x2; c1 = x1; c0 = x0; end
    8'b00110001 : begin c7 = x7; c6 = x6; c5 = 5'b00010; c4 = 4'b0110; c3 =
4'b1001; c2 = x2; c1 = x1; c0 = x3; end
    8'b00110010 : begin c7 = x7; c6 = x6; c5 = 5'b00010; c4 = 4'b0110; c3 =
4'b1010; c2 = x2; c1 = x3; c0 = x0; end
    8'b00110011 : begin c7 = x7; c6 = x6; c5 = 5'b00010; c4 = 4'b0110; c3 =
4'b1011; c2 = x2; c1 = dd; c0 = x3; end
    8'b00110100 : begin c7 = x7; c6 = x6; c5 = 5'b00010; c4 = 4'b0110; c3 =
4'b1100; c2 = x3; c1 = x1; c0 = x0; end
    8'b00110101 : begin c7 = x7; c6 = x6; c5 = 5'b00010; c4 = 4'b0110; c3 =
4'b1101; c2 = x3; c1 = x1; c0 = dd; end
    8'b00110110 : begin c7 = x7; c6 = x6; c5 = 5'b00010; c4 = 4'b0110; c3 =
4'b1110; c2 = x3; c1 = dd; c0 = x0; end
    8'b00110111 : begin c7 = x7; c6 = x6; c5 = 5'b00010; c4 = 4'b0110; c3 =
4'b1111; c2 = x3; c1 = dd; c0 = dd; end
    8'b00111000 : begin c7 = x7; c6 = x6; c5 = 5'b00010; c4 = 4'b0111; c3 =
4'b1000; c2 = x2; c1 = x1; c0 = x0; end
    8'b00111001 : begin c7 = x7; c6 = x6; c5 = 5'b00010; c4 = 4'b0111; c3 =
4'b1001; c2 = x2; c1 = x1; c0 = dd, end
    8'b00111010 : begin c7 = x7; c6 = x6; c5 = 5'b00010; c4 = 4'b0111; c3 =
4'b1010; c2 = x2; c1 = dd; c0 = x0; end
```

-continued

```
8'b00111011 : begin c7 = x7; c6 = x6; c5 = 5'b00010; c4 = 4'b0111; c3 =
4'b1011; c2 = x2; c1 = dd; c0 = dd; end
8'b00111100 : begin c7 = x7; c6 = x6; c5 = 5'b00010; c4 = 4'b0111; c3 =
4'b1100; c2 = dd; c1 = x1; c0 = x0; end
8'b00111101 : begin c7 = x7; c6 = x6; c5 = 5'b00010; c4 = 4'b0111; c3 =
4'b1101; c2 = dd; c1 = x1; c0 = dd; end
8'b00111110 : begin c7 = x7; c6 = x6; c5 = 5'b00010; c4 = 4'b0111; c3 =
4'b1110; c2 = dd; c1 = dd; c0 = x0; end
8'b00111111 : begin c7 = x7; c6 = x6; c5 = 5'b00010; c4 = 4'b0111; c3 =
4'b1111; c2 = dd; c1 = dd; c0 = dd; end
8'b01000000 : begin c7 = x7; c6 = x5; c5 = 5'b11100; c4 = x4; c3 =
x3; c2 = x2; c1 = x1; c0 = x0; end
8'b01000001 : begin c7 = x7; c6 = x5; c5 = 5'b11000; c4 = 4'b1000; c3 =
x3; c2 = x2; c1 = x1; c0 = x4; end
8'b01000010 : begin c7 = x7; c6 = x4; c5 = 5'b11000; c4 = 4'b1001; c3 =
x3; c2 = x2; c1 = x5; c0 = x0; end
8'b01000011 : begin c7 = x7; c6 = x3; c5 = 5'b01010; c4 = 4'b0000; c3 =
4'b1011; c2 = x2; c1 = x5; c0 = x4; end
8'b01000100 : begin c7 = x7 c6 = x4; c5 = 5'b1 1000; c4 = 4'b1010; c3 =
x3; c2 = x5; c1 = x1; c0 = x0; end
8'b01000101 : begin c7 = x7; c6 = x5; c5 = 5'b01010; c4 = 4'b0000; c3 =
4'b1101; c2 = x3; c1 = x1; c0 = x4; end
8'b01000110 : begin c7 = x7; c6 = x4; c5 = 5'b01010; c4 = 4'b0000; c3 =
4'b1110; c2 = x3; c1 = x5; c0 = x0; end
8'b01000111 : begin c7 = x7; c6 = dd; c5 = 5'b01010; c4 = 4'b0000; c3 =
4'b1111; c2 = x3; c1 = x5; c0 = x4; end
8'b01001000 : begin c7 = x7; c6 = x4; c5 = 5'b11000; c4 = 4'b1011; c3 =
x5; c2 = x2; c1 = x1; c0 = x0; end
8'b01001001 : begin c7 = x7; c6 = x5; c5 = 5'b01010; c4 = 4'b0001; c3 =
4'b1001; c2 = x2; c1. = x1; c0 = x4; end
8'b01001010 : begin c7 = x7; c6 = x4; c5 = 5'b01010; c4 = 4'b0001; c3 =
4'b1010; c2 = x2; c1 = x5; c0 = x0; end
8'b01001011 : begin c7 = x7; c6 = dd; c5 = 5'b01010; c4 = 4'b0001; c3 =
4'b1011; c2 = x2; c1 = x5; c0 = x4; end
8'b01001100 : begin c7 = x7; c6 = x4; c5 = 5'b01010; c4 = 4'b0001; c3 =
4'b1100; c2 = x5; c1 = x1; c0 = x0; end
8'b01001101 : begin c7 = x7; c6 = dd; c5 = 5'b01010; c4 = 4'b0001; c3 =
4'b1101; c2 = x5; c1 = x1; c0 = x4; end
8'b01001110 : begin c7 = x7; c6 = x4; c5 = 5'b01010; c4 = 4'b0001; c3 =
4'b1110; c2 = dd; c1 = x5; c0 = x0; end
8'b01001111 : begin c7 = x7; c6 = dd; c5 = 5'b01010; c4 = 4'b0001; c3 =
4'b1111; c2 = dd; c1 = x5; c0 = x4; end
8'b01010000 : begin c7 = x7; c6 = x5; c5 = 5'b11000; c4 = 4'b1100; c3 =
x3; c2 = x2; c1 = x1; c0 = x0; end
8'b01010001 : begin c7 = x7; c6 = x5; c5 = 5'b01010; c4 = 4'b0010; c3 =
4'b1001; c2 = x2; c1 = x1; c0 = x3; end
8'b01010010 : begin c7 = x7; c6 = x3; c5 = 5'b01010; c4 = 4'b0010; c3 =
4'b1010; c2 = x2; c1 = x5; c0 = x0; end
8'b01010011 : begin c7 = x7; c6 = dd; c5 = 5'b01010; c4 = 4'b0010; c3 =
4'b1011; c2 = x2; c1 = x5; c0 = x3; end
8'b01010100 : begin c7 = x7; c6 = x5; c5 = 5'b01010; c4 = 4'b0010; c3 =
4'b1100; c2 = x3; c1 = x1; c0 = x0; end
8'b01010101 : begin c7 = x7; c6 = x5; c5 = 5'b01010; c4 = 4'b0010; c3 =
4'b1101; c2 = x3; c1 = x1; c0 = dd; end
8'b01010110 : begin c7 = x7; c6 = dd; c5 = 5'b01010; c4 = 4'b0010; c3 =
4'b1110; c2 = x3; c1 = x5; c0 = x0; end
8'b01010111 : begin c7 = x7; c6 = dd; c5 = 5'b01010; c4 = 4'b0010; c3 =
4'b1111; c2 = x3; c1 = x5; c0 = dd; end
8'b01011000 : begin c7 = x7; c6 = x5; c5 = 5'b01010; c4 = 4'b0011; c3 =
4'b1000; c2 = x2; c1 = x1; c0 = x0; end
8'b01011001 : begin c7 = x7; c6 = x5; c5 = 5'b01010; c4 = 4'b0011; c3 =
4'b1001; c2 = x2; c1 = x1; c0 = dd; end
8'b01011010 : begin c7 = x7; c6 = dd; c5 = 5'b01010; c4 = 4'b0011; c3 =
4'b1010; c2 = x2; c1 = x5; c0 = x0; end
8'b01011011 : begin c7 = x7; c6 = dd; c5 = 5'b01010; c4 = 4'b0011; c3 =
4'b1011; c2 = x2; c1 = x5; c0 = dd; end
8'b01011100 : begin c7 = x7; c6 = dd; c5 = 5'b01010; c4 = 4'b0011; c3 =
4'b1100; c2 = x5; c1 = x1; c0 = x0; end
8'b01011101 : begin c7 = x7; c6 = dd; c5 = 5'b01010; c4 = 4'b0011; c3 =
4'b1101; c2 = x5; c1 = x1; c0 = dd; end
8'b01011110 : begin c7 = x7; c6 = dd; c5 = 5'b01010; c4 = 4'b0011; c3 =
4'b1110; c2 = dd; c1 = x5; c0 = x0; end
8'b01011111 : begin c7 = x7; c6 = dd; c5 = 5'b01010; c4 = 4'b0011; c3 =
4'b1111; c2 = dd; c1 = x5; c0 = dd; end
8'b01100000 : begin c7 = x7; c6 = x4; c5 = 5'b11000; c4 = 4'b1101; c3 =
x3; c2 = x2; c1 = x1; c0 = x0; end
8'b01100001 : begin c7 = x7; c6 = x3; c5 = 5'b01010; c4 = 4'b0100; c3 =
4'b1001; c2 = x2; c1 = x1; c0 = x4; end
8'b01100010 : begin c7 = x7; c6 = x3; c5 = 5'b01010; c4 = 4'b0100; c3 =
```

```
4'b1010; c2 = x2; c1 = x4; c0 = x0; end
  8'b01100011 : begin c7 = x7; c6 = x3; c5 = 5'b01010; c4 = 4'b0100; c3 =
4'b1011; c2 = x2; c1 = dd; c0 = x4; end
  8'b01100100 : begin c7 = x7; c6 = x4; c5 = 5'b01010; c4 = 4'b0100; c3 =
4'b1100; c2 = x3; c1 = x1; c0 = x0; end
  8'b01100101 : begin c7 = x7; c6 = dd; c5 = 5'b01010; c4 = 4'b0100; c3 =
4'b1101; c2 = x3; c1 = x1; c0 = x4; end
  8'b01111011 : begin c7 = x7; c6 = dd; c5 = 5'b01010; c4 = 4'b0111; c3 =
4'b1011; c2 = x2; c1 = dd; c0 = dd; end
  8'b01111100 : begin c7 = x7; c6 = dd; c5 = 5'b01010; c4 = 4'b0111; c3 =
4'b1100; c2 = dd; c1 = x1; c0 = x0; end
  8'b01111101 : begin c7 = x7; c6 = dd; c5 = 5'b01010; c4 = 4'b0111; c3 =
4'b1101; c2 = dd; c1 = x1; c0= dd; end
  8'b01111110 : begin c7 = x7; c6 = dd; c5 = 5'b01010; c4 = 4'b0111; c3 =
4'b1110; c2 = dd; c1 = dd; c0 = x0; end
  8'b01111111 : begin c7 = x7; c6 = dd; c5 = 5'b01010; c4 = 4'b0111; c3 =
4'b1111; c2 = dd; c1 = dd; c0 = dd; end
  8'b10000000 : begin c7 = x5; c6 = x6; c5 = 5'b11110; c4 = x4; c3 =
x3; c2 = x2; c1 = x1; c0 = x0; end
  8'b10000001 : begin c7 = x5; c6 = x6; c5 = 5'b11010; c4 = 4'b1000; c3 =
x3; c2 = x2; c1 = x1; c0 = x4; end
  8'b10000010 : begin c7 = x4; c6 = x6; c5 = 5'b11010; c4 = 4'b1001; c3 =
x3; c2 = x2; c1 = x5; c0 = x0; end
  8'b10000011 : begin c7 = x3; c6 = x6; c5 = 5'b10010; c4 = 4'b0000; c3 =
4'b1011; c2 = x2; c1 = x5; c0 = x4; end
  8'b10000100 : begin c7 = x4; c6 = x6; c5 = 5'b11010; c4 = 4'b1010; c3 =
x3; c2 = x5; c1 = x1; c0 = x0; end
  8'b10000101 : begin c7 = x5; c6 = x6; c5 = 5'b10010; c4 = 4'b0000; c3 =
4'b1101; c2 = x3; c1 = x1; c0 = x4; end
  8'b10000110 : begin c7 = x4; c6 = x6; c5 = 5'b10010; c4 = 4'b0000; c3 =
4'b1110; c2 = x3; c1 = x5; c0 = x0; end
  8'b10000111 : begin c7 = dd; c6 = x6; c5 = 5'b10010; c4 = 4'b0000; c3 =
4'b1111; c2 = x3; c1 = x5; c0 = x4; end
  8'b10001000 : begin c7 = x4; c6 = x6; c5 = 5'b11010; c4 = 4'b1011; c3 =
x5; c2 = x2; c1 = x1; c0 = x0; end
  8'b10001001 : begin c7 = x5; c6 = x6; c5 = 5'b10010; c4 = 4'b0001; c3 =
4'b1001; c2 = x2; c1 = x1; c0 = x4; end
  8'b10001010 : begin c7 = x4; c6 = x6; c5 = 5'b10010; c4 = 4'b0001; c3 =
4'b1010; c2 = x2; c1 = x5; c0 = x0; end
  8'b10001011 : begin c7 = dd; c6 = x6; c5 = 5'b10010; c4 = 4'b0001; c3 =
4'b1011; c2 = x2; c1 = x5; c0 = x4; end
  8'b10001100 : begin c7 = x4; c6 = x6; c5 = 5'b10010; c4 = 4'b0001; c3 =
4'b1100; c2 = x5; c1 = x1; c0 = x0; end
  8'b10001101 : begin c7 = dd; c6 = x6; c5 = 5'b10010; c4 = 4'b0001; c3 =
4'b1101; c2 = x5; c1 = x1; c0 = x4; end
  8'b10001110 : begin c7 = x4; c6 = x6; c5 = 5'b10010; c4 = 4'b0001; c3 =
4'b1110; c2 = dd; c1 = x5; c0 = x0; end
  8'b10001111 : begin c7 = dd; c6 = x6; c5 = 5'b10010; c4 = 4'b0001; c3 =
4'b1111; c2 = dd; c1 = x5; c0 = x4; end
  8'b10010000 : begin c7 = x5; c6 = x6; c5 = 5'b11010; c4 = 4'b1100; c3 =
x3; c2 = x2; c1 = x1; c0 = x0; end
  8'b10010001 : begin c7 = x5; c6 = x6; c5 = 5'b10010; c4 = 4'b0010; c3 =
4'b1001; c2 = x2; c1 = x1; c0 = x3; end
  8'b10010010 : begin c7 = x3; c6 = x6; c5 = 5'b10010; c4 = 4'b0010; c3 =
4'b1010; c2 = x2; c1 = x5; c0 = x0; end
  8'b10010011 : begin c7 = dd; c6 = x6; c5 = 5'b10010; c4 = 4'b0010; c3 =
4'b1011; c2 = x2; c1 = x5; c0 = x3; end
  8'b10010100 : begin c7 = x5; c6 = x6; c5 = 5'b10010; c4 = 4'b0010; c3 =
4'b1100; c2 = x3; c1 = x1; c0 = x0; end
  8'b10010101 : begin c7 = x5; c6 = x6; c5 = 5'b10010; c4 = 4'b0010; c3 =
4'b1101; c2 = x3; c1 = x1; c0 = dd; end
  8'b10010110 : begin c7 = dd; c6 = x6; c5 = 5'b10010; c4 = 4'b0010; c3 =
4'b1110; c2 = x3; c1 = x5; c0 = x0; end
  8'b10010111 : begin c7 = dd; c6 = x6; c5 = 5'b10010; c4 = 4'b0010; c3 =
4'b1111; c2 = x3; c1 = x5; c0 = dd; end
  8'b10011000 : begin c7 = x5; c6 = x6; c5 = 5'b10010; c4 = 4'b0011; c3 =
4'b1000; c2 = x2; c1 = x1; c0 = x0; end
  8'b10011001 : begin c7 = x5; c6 = x6; c5 = 5'b10010; c4 = 4'b0011; c3 =
4'b1001; c2 = x2; c1 = x1; c0 = dd; end
  8'b10011010 : begin c7 = dd; c6 = x6; c5 = 5'b10010; c4 = 4'b0011; c3 =
4'b1010; c2 = x2; c1 = x5; c0 = x0; end
  8'b10011011 : begin c7 = dd; c6 = x6; c5 = 5'b10010; c4 = 4'b0011; c3 =
4'b1011; c2 = x2; c1 = x5; c0 = dd; end
  8'b10011100 : begin c7 = dd; c6 = x6; c5 = 5'b10010; c4 = 4'b0011; c3 =
4'b1100; c2 = x5; c1 = x1; c0 = x0; end
  8'b10011101 : begin c7 = dd; c6 = x6; c5 = 5'b10010; c4 = 4'b0011; c3 =
4'b1101; c2 = x5; c1 = x1; c0 = dd; end
  8'b10011110 : begin c7 = dd; c6 = x6; c5 = 5'b10010; c4 = 4'b0011; c3 =
4'b1110; c2 = dd; c1 = x5; c0 = x0; end
```

-continued

```
8'b10011111 : begin c7 = dd; c6 = x6; c5 = 5'b10010; c4 = 4'b0011; c3 =
4'b1111; c2 = dd; c1 = x5; c0 = dd; end
8'b10100000 : begin c7 = x4; c6 = x6; c5 = 5'b11010; c4 = 4'b1101; c3 =
x3; c2 = x2; c1 = x1; c0 = x0; end
8'b10100001 : begin c7 = x3; c6 = x6; c5 = 5'b10010; c4 = 4'b0100; c3 =
4'b1001; c2 = x2; c1 = x1; c0 = x4; end
8'b10100010 : begin c7 = x3; c6 = x6; c5 = 5'b10010; c4 = 4'b0100; c3 =
4'b1010; c2 = x2; c1 = x4; c0 = x0; end
8'b10100011 : begin c7 = x3; c6 = x6; c5 = 5'b10010; c4 = 4'b0100; c3 =
4'b1011; c2 = x2; c1 = dd; c0 = x4; end
8'b10100100 : begin c7 = x4; c6 = x6; c5 = 5'b10010; c4 = 4'b0100; c3 =
4'b1100; c2 = x3; c1 = x1; c0 = x0; end
8'b10100101 : begin c7 = dd; c6 = x6; c5 = 5'b10010; c4 = 4'b0100; c3 =
4'b1101; c2 = x3; c1 = x1; c0 = x4; end
8'b10100110 : begin c7 = dd; c6 = x6; c5 = 5'b10010; c4 = 4'b0100; c3 =
4'b1110; c2 = x3; c1 = x4; c0 = x0; end
8'b10100111 : begin c7 = dd; c6 = x6; c5 = 5'b10010; c4 = 4'b0100; c3 =
4'b1111; c2 = x3; c1 = dd; c0 = x4; end
8'b10101000 : begin c7 = x4; c6 = x6; c5 = 5'b10010; c4 = 4'b0101; c3 =
4'b1000; c2 = x2; c1 = x1; c0 = x0; end
8'b10101001 : begin c7 = dd; c6 = x6; c5 = 5'b10010; c4 = 4'b0101; c3 =
4'b1001; c2 = x2; c1 = x1; c0 = x4; end
8'b10101010 : begin c7 = dd; c6 = x6; c5 = 5'b10010; c4 = 4'b0101; c3 =
4'b1010; c2 = x2; c1 = x4; c0 = x0; end
8'b10101011 : begin c7 = dd; c6 = x6; c5 = 5'b10010; c4 = 4'b0101; c3 =
4'b1011; c2 = x2; c1 = dd; c0 = x4; end
8'b10101100 : begin c7 = x4; c6 = x6; c5 = 5'b10010; c4 = 4'b0101; c3 =
4'b1100; c2 = dd; c1 = x1; c0 = x0; end
8'b10101101 : begin c7 = dd; c6 = x6; c5 = 5'b10010; c4 = 4'b0101; c3 =
4'b1101; c2 = dd; c1 = x1; c0 = x4; end
8'b10101110 : begin c7 = dd; c6 = x6; c5 = 5'b10010; c4 = 4'b0101; c3 =
4'b1110; c2 = dd; c1 = x4; c0 = x0; end
8'b10101111 : begin c7 = dd; c6 = x6; c5 = 5'b10010; c4 = 4'b0101; c3 =
4'b1111; c2 = dd; c1 = dd; c0 = x4; end
8'b10110000 : begin c7 = x3; c6 = x6; c5 = 5'b10010; c4 = 4'b0110; c3 =
4'b1000; c2 = x2; c1 = x1; c0 = x0; end
8'b10110001 : begin c7 = dd; c6 = x6; c5 = 5'b10010; c4 = 4'b0110; c3 =
4'b1001; c2 = x2; c1 = x1; c0 = x3; end
8'b10110010 : begin c7 = dd; c6 = x6; c5 = 5'b10010; c4 = 4'b0110; c3 =
4'b1010; c2 = x2; c1 = x3; c0 = x0; end
8'b10110011 : begin c7 = dd; c6 = x6; c5 = 5'b10010; c4 = 4'b0110; c3 =
4'b1011; c2 = x2; c1 = dd; c0 = x3; end
8'b10110100 : begin c7 = dd; c6 = x6; c5 = 5'b10010; c4 = 4'b0110; c3 =
4'b1100; c2 = x3; c1 = x1; c0 = x0; end
8'b10110101 : begin c7 = dd; c6 = x6; c5 = 5'b10010; c4 = 4'b0110; c3 =
4'b1101; c2 = x3; c1 = x1; c0 = dd; end
8'b10110110 : begin c7 = dd; c6 = x6; c5 = 5'b10010; c4 = 4'b0110; c3 =
4'b1110; c2 = x3; c1 = dd; c0 = x0; end
8'b10110111 : begin c7 = dd; c6 = x6; c5 = 5'b10010; c4 = 4'b0110; c3 =
4'b1111; c2 = x3; c1 = dd; c0 = dd; end
8'b10111000 : begin c7 = dd; c6 = x6; c5 = 5'b10010; c4 = 4'b0111; c3 =
4'b1000; c2 = x2; c1 = x1; c0 = x0; end
8'b10111001 : begin c7 = dd; c6 = x6; c5 = 5'b10010; c4 = 4'b0111; c3 =
4'b1001; c2 = x2; c1 = x1; c0 = dd; end
8'b10111010 : begin c7 = dd; c6 = x6; c5 = 5'b10010; c4 = 4'b0111; c3 =
4'b1010; c2 = x2; c1 = dd; c0 = x0; end
8'b10111011 : begin c7 = dd; c6 = x6; c5 = 5'b10010; c4 = 4'b0111; c3 =
4'b1011; c2 = x2; c1 = dd; c0 = dd; end
8'b10111100 : begin c7 = dd; c6 = x6; c5 = 5'b10010; c4 = 4'b0111; c3 =
4'b1100; c2 = dd; c1 = x1; c0 = x0; end
8'b10111101 : begin c7 = dd; c6 = x6; c5 = 5'b10010; c4 = 4'b0111; c3 =
4'b1101; c2 = dd; c1 = x1; c0 = dd; end
8'b10111110 : begin c7 = dd; c6 = x6; c5 = 5'b10010; c4 = 4'b0111; c3 =
4'b1110; c2 = dd; c1 = dd; c0 = x0; end
8'b10111111 : begin c7 = dd; c6 = x6; cs = 5'b10010; c4 = 4'b0111; c3 =
4'b1111; c2 = dd; c1 = dd; c0 = dd; end
8'b11000000 : begin c7 = x5; c6 = x4; c5 = 5'b11010; c4 = 4'b1110; c3 =
x3; c2 = x2; c1 = x1; c0 = x0; end
8'b11000001 : begin c7 = x5; c6 = x3; c5 = 5'b11010; c4 = 4'b0000; c3 =
4'b1001; c2 = x2; c1 = x1; c0 = x4; end
8'b11000010 : begin c7 = x3; c6 = x4; c5 = 5'b11010; c4 = 4'b0000; c3 =
4'b1010; c2 = x2; c1 = x5; c0 = x0; end
8'b11000011 : begin c7 = dd; c6 = x3; c5 = 5'b11010; c4 = 4'b0000; c3 =
4'b1011; c2 = x2; c1 = x5; c0 = x4; end
8'b11000100 : begin c7 = x5; c6 = x4; c5 = 5'b11010; c4 = 4'b0000; c3 =
4'b1100; c2 = x3; c1 = x1; c0 = x0; end
8'b11000101 : begin c7 = x5; c6 = dd; c5 = 5'b11010; c4 = 4'b0000; c3 =
4'b1101; c2 = x3; c1 = x1; c0 = x4; end
8'b11000110 : begin c7 = dd; c6 = x4; c5 = 5'b11010; c4 = 4'b0000; c3 =
```

-continued

```
4'b1110; c2 = x3; c1 = x5; c0 = x0; end
  8'b11000111 : begin c7 = dd; c6 = dd; c5 = 5'b11010; c4 = 4'b0000; c3 =
4'b1111; c2 = x3; c1 = x5; c0 = x4; end
  8'b11001000 : begin c7 = x5; c6 = x4; c5 = 5'b11010; c4 = 4'b0001; c3 =
4'b1000; c2 = x2; c1 = x1; c0 = x0; end
  8'b11001001 : begin c7 = x5; c6 = dd; c5 = 5'b11010; c4 = 4'b0001; c3 =
4'b1001; c2 = x2; c1 = x1; c0 = x4; end
  8'b11001010 : begin c7 = dd; c6 = x4; c5 = 5'b11010; c4 = 4'b0001; c3 =
4'b1010; c2 = x2; c1 = x5; c0 = x0; end
  8'b11001011 : begin c7 = dd; c6 = dd; c5 = 5'b11010; c4 = 4'b0001; c3 =
4'b1011; c2 = x2; c1 = x5; c0 = x4; end
  8'b11001100 : begin c7 = dd; c6 = x4; c5 = 5'b11010; c4 = 4'b0001; c3 =
4'b1100; c2 = x5; c1 = x1; c0 = x0; end
  8'b11001101 : begin c7 = dd; c6 = dd; c5 = 5'b11010; c4 = 4'b0001; c3 =
4'b1101; c2 = x5; c1 = x1; c0 = x4; end
  8'b11001110 : begin c7 = dd; c6 = x4; c5 = 5'b11010; c4 = 4'b0001; c3 =
4'b1110; c2 = dd; c1 = x5; c0 = x0; end
  8'b11001111 : begin c7 = dd; c6 = dd; c5 = 5'b11010; c4 = 4'b0001; c3 =
4'b1111; c2 = dd; c1 = x5; c0 = x4; end
  8'b11010000 : begin c7 = x5; c6 = x3; c5 = 5'b11010; c4 = 4'b0010; c3 =
4'b1000; c2 = x2; c1 = x1; c0 = x0; end
  8'b11010001 : begin c7 = x5; c6 = dd; c5 = 5'b11010; c4 = 4'b0010; c3 =
4'b1001; c2 = x2; c1 = x1; c0 = x3; end
  8'b11010010 : begin c7 = dd; c6 = x3; c5 = 5'b11010; c4 = 4'b0010; c3 =
4'b1010; c2 = x2; c1 = x5; c0 = x0; end
  8'b11010011 : begin c7 = dd; c6 = dd; c5 = 5'b11010; c4 = 4'b0010; c3 =
4'b1011; c2 = x2; c1 = x5; c0 = x3; end
  8'b11010100 : begin c7 = x5; c6 = dd; c5 = 5'b11010; c4 = 4'b0010; c3 =
4'b1100; c2 = x3; c1 = x1; c0 = x0; end
  8'b11010101 : begin c7 = x5; c6 = dd; c5 = 5'b11010; c4 = 4'b0010; c3 =
4'b1101; c2 = x3; c1 = x1; c0 = dd; end
  8'b11010110 : begin c7 = dd; c6 = dd; c5 = 5'b11010; c4 = 4'b0010; c3 =
4'b1110; c2 = x3; c1 = x5; c0 = x0; end
  8'b11010111 : begin c7 = dd; c6 = dd; c5 = 5'b11010; c4 = 4'b0010; c3 =
4'b1111; c2 = x3; c1 = x5; c0 = dd; end
  8'b11011000 : begin c7 = x5; c6 = dd; c5 = 5'b11010; c4 = 4'b0011; c3 =
4'b1000; c2 = x2; c1 = x1; c0 = x0; end
  8'b11011001 : begin c7 = x5; c6 = dd; c5 = 5'b11010; c4 = 4'b0011; c3 =
4'b1001; c2 = x2; c1 = x1; c0 = dd; end
  8'b11011010 : begin c7 = dd; c6 = dd; c5 = 5'b11010; c4 = 4'b0011; c3 =
4'b1010; c2 = x2; c1 = x5; c0 = x0; end
  8'b11011011 : begin c7 = dd; c6 = dd; c5 = 5'b11010; c4 = 4'b0011; c3 =
4'b1011; c2 = x2; c1 = x5; c0 = dd; end
  8'b11011100 : begin c7 = dd; c6 = dd; c5 = 5'b11010; c4 = 4'b0011; c3 =
4'b1100; c2 = x5; c1 = x1; c0 = x0; end
  8'b11011101 : begin c7 = dd; c6 = dd; c5 = 5'b11010; c4 = 4'b0011; c3 =
4'b1101; c2 = x5; c1 = x1; c0 = dd; end
  8'b11011110 : begin c7 = dd; c6 = dd; c5 = 5'b11010; c4 = 4'b0011; c3 =
4'b1110; c2 = dd; c1 = x5; c0 = x0; end
  8'b11011111 : begin c7 = dd; c6 = dd; c5 = 5'b11010; c4 = 4'b0011; c3 =
4'b1111; c2 = dd; c1 = x5; c0 = dd; end
  8'b11100000 : begin c7 = x3; c6 = x4; c5 = 5'b11010; c4 = 4'b0100; c3 =
4'b1000; c2 = x2; c1 = x1; c0 = x0; end
  8'b11100001 : begin c7 = x3; c6 = dd; c5 = 5'b11010; c4 = 4'b0100; c3 =
4'b1001; c2 = x2; c1 = x1; c0 = x4; end
  8'b11100010 : begin c7 = x3; c6 = dd; c5 = 5'b11010; c4 = 4'b0100; c3 =
4'b1010; c2 = x2; c1 = x4; c0 = x0; end
  8'b11100011 : begin c7 = dd; c6 = x3; c5 = 5'b11010; c4 = 4'b0100; c3 =
4'b1011; c2 = x2; c1 = dd; c0 = x4; end
  8'b11100100 : begin c7 = dd; c6 = x4; c5 = 5'b11010; c4 = 4'b0100; c3 =
4'b1100; c2 = x3; c1 = x1; c0 = x0; end
  8'b11100101 : begin c7 = dd; c6 = dd; c5 = 5'b11010; c4 = 4'b0100; c3 =
4'b1101; c2 = x3; c1 = x1; c0 = x4; end
  8'b11100110 : begin c7 = dd; c6 = dd; c5 = 5'b11010; c4 = 4'b0100; c3 =
4'b1110; c2 = x3; c1 = x4; c0 = x0; end
  8'b11100111 : begin c7 = dd; c6 = dd; c5 = 5'b11010; c4 = 4'b0100; c3 =
4'b1111; c2 = x3; c1 = dd; c0 = x4; end
  8'b11101000 : begin c7 = dd; c6 = x4; c5 = 5'b11010; c4 = 4'b0101; c3 =
4'b1000; c2 = x2; c1 = x1; c0 = x0; end
  8'b11101001 : begin c7 = dd; c6 = dd; c5 = 5'b11010; c4 = 4'b0101; c3 =
4'b1001; c2 = x2; c1 = x1; c0 = x4; end
  8'b11101010 : begin c7 = dd; c6 = dd; c5 = 5'b11010; c4 = 4'b0101; c3 =
4'b1010; c2 = x2; c1 = x4; c0 = x0; end
  8'b11101011 : begin c7 = dd; c6 = dd; c5 = 5'b11010; c4 = 4'b0101; c3 =
4'b1011; c2 = x2; c1 = dd; c0 = x4; end
  8'b11101100 : begin c7 = dd; c6 = x4; c5 = 5'b11010; c4 = 4'b0101; c3 =
4'b1100; c2 = dd; c1 = x1; c0 = x0; end
  8'b11101101 : begin c7 = dd; c6 = dd; c5 = 5'b11010; c4 = 4'b0101; c3 =
4'b1101; c2 = dd; c1 = x1; c0 = x4; end
```

-continued

```
    8'b11101110 : begin c7 = dd; c6 = dd; c5 = 5'b11010; c4 = 4'b0101; c3 =
4'b1110; c2 = dd; c1 = x4; c0 = x0; end
    8'b11101111 : begin c7 = dd; c6 = dd; c5 = 5'b11010; c4 = 4'b0101; c3 =
4'b1111; c2 = dd; c1 = dd; c0 = x4; end
    8'b11110000 : begin c7 = dd; c6 = x3; c5 = 5'b11010; c4 = 4'b0110; c3 =
4'b1000; c2 = x2; c1 = x1; c0 = x0; end
    8'b11110001 : begin c7 = dd; c6 = dd; c5 = 5'b11010; c4 = 4'b0110; c3 =
4'b1001; c2 = x2; c1 = x1; c0 = x3; end
    8'b11110010 : begin c7 = dd; c6 = dd; c5 = 5'b11010; c4 = 4'b0110; c3 =
4'b1010; c2 = x2; c1 = x3; c0 = x0; end
    8'b11110011 : begin c7 = dd; c6 = dd; c5 = 5'b11010; c4 = 4'b0110; c3 =
4'b1011; c2 = x2; c1 = dd; c0 = x3; end
    8'b11110100 : begin c7 = dd; c6 = dd; c5 = 5'b11010; c4 = 4'b0110; c3 =
4'b1100; c2 = x3; c1 = x1; c0 = x0; end
    8'b11110101 : begin c7 = dd; c6 = dd; c5 = 5'b11010; c4 = 4'b0110; c3 =
4'b1101; c2 = x3; c1 = x1; c0 = dd; end
    8'b11110110 : begin c7 = dd; c6 = dd; c5 = 5'b11010; c4 = 4'b0110; c3 =
4'b1110; c2 = x3; c1 = dd; c0 = x0; end
    8'b11110111 : begin c7 = dd; c6 = dd; c5 = 5'b11010; c4 = 4'b0110; c3 =
4'b1111; c2 = x3; c1 = dd; c0 = dd; end
    8'b11111000 : begin c7 = dd; c6 = dd; c5 = 5'b11010; c4 = 4'b0111; c3 =
4'b1000; c2 = x2; c1 = x1; c0 = x0; end
    8'b11111001 : begin c7 = dd; c6 = dd; c5 = 5'b11010; c4 = 4'b0111; c3 =
4'b1001; c2 = x2; c1 = x1; c0 = dd; end
    8'b11111010 : begin c7 = dd; c6 = dd; c5 = 5'b11010; c4 = 4'b0111; c3 =
4'b1010; c2 = x2; c1 = dd; c0 = x0; end
    8'b11111011 : begin c7 = dd; c6 = dd; c5 = 5'b11010; c4 = 4'b0111; c3 =
4'b1011; c2 = x2; c1 = dd; c0 = dd; end
    8'b11111100 : begin c7 = dd; c6 = dd; c5 = 5'b11010; c4 = 4'b0111; c3 =
4'b1100; c2 = dd; c1 = x1; c0 = x0; end
    8'b11111101 : begin c7 = dd; c6 = dd; c5 = 5'b11010; c4 = 4'b0111; c3 =
4'b1101; c2 = dd; c1 = x1; c0 = dd; end
    8'b11111110 : begin c7 = dd; c6 = dd; c5 = 5'b11010; c4 = 4'b0111; c3 =
4'b1110; c2 = dd; c1 = dd; c0 = x0; end
    8'b11111111 : begin c7 = dd; c6 = dd; c5 = 5'b11010; c4 = 4'b0111; c3 =
4'b1111; c2 = dd; c1 = dd; c0 = dd; end
    endcase
  end
endmodule
```

Decoder Implementation: The following is a listing in the Verilog language of logic definitions and equations implementing a modulation decoder for decoding code words formed in accordance with coding rules of the present invention.

```
timescale 1ns/1ns
module dec3233k6_case (c0 , c1, c2, c3, c4, c5, c6, c7, r0, r1, r2, r3, r4, r5, r6,
r7);
input [3:0] c0;
input [3:0] c1;
input [3:0] c2;
input [3:0] c3;
input [3:0] c4;
input [4:0] c5;
input [3:0] c6;
input [3:0] c7;
output [3:0] r0;
output [3:0] r1;
output [3:0] r2;
output [3:0] r3;
output [3:0] r4;
output [3:0] r5;
output [3:0] r6;
output [3:0] r7;
reg [3:0] r0;
reg [3:0] r1;
reg [3:0] r2;
reg [3:0] r3;
reg [3:0] r4;
reg [3:0] r5;
reg [3:0] r6;
reg [3:0] r7;
reg [7:0] flag;
wire [3:0] zz 4'b0000;
```

-continued

```
always @ (c0 or c1 or c2 or c3 or c4 or c5 or c6 or c7)
begin
  if (c5[0])
  begin
    flag = 8'd0;
  end
  else
  begin
    if (c5[2])
    begin
      case ({c5[4:3], c5[1]})
        3'b000 : begin flag = 8'b00000001; end
        3'b001 : begin flag = 8'b00000010; end
        3'b010 : begin flag = 8'b00000100; end
        3'b011 : begin flag = 8'b00001000; end
        3'b100 : begin flag = 8'b00010000; end
        3'b101 : begin flag = 8'b00100000; end
        3'b110 : begin flag = 8'b01000000; end
        3'b111 : begin flag = 8'b10000000; end
      endcase
    end
    else
    begin
      if(c4[3])
      begin
        case(c4[2:0])
          3'b000 : begin flag = 8'b00000001; end
          3'b001 : begin flag = 8'b00000010; end
          3'b010 : begin flag = 8'b00000100; end
          3'b011 : begin flag = 8'b00001000; end
          3'b100 : begin flag = 8'b00010000; end
          3'b101 : begin flag = 8'b00100000; end
          3'b110 : begin flag = 8'b01000000; end
          3'b111 : begin flag = 8'b10000000; end
        endcase
        case({c5[4:3], c5[1]})
          3'b000 : begin flag = flag | 8'b00000001; end
          3'b001 : begin flag = flag | 8'b00000010; end
          3'b010 : begin flag = flag | 8'b00000100; end
          3'b011 : begin flag = flag | 8'b00001000; end
          3'b100 : begin flag = flag | 8'b00010000; end
          3'b101 : begin flag = flag | 8'b00100000; end
          3'b110 : begin flag = flag | 8'b01000000; end
          3'b111 : begin flag = flag | 8'b10000000; end
        endcase
      end
      else
      begin
        flag = {c5[4:3], c4[2:0], c3[2:0]};
      end
    end
  end
case (flag)
  8'b00000000 : begin r7 = c7; r6 = c6; r5 = c5[4:1]; r4 = c4; r3 = c3;
r2 = c2; r1 = c1; r0 = c0; end
  8'b00000001 : begin r7 = c7; r6 = c6; r5 = c0; r4 = c4; r3 = c3;
r2 = c2; r1 = c1; r0 = zz; end
  8'b00000010 : begin r7 = c7; r6 = c6; r5 = c1; r4 = c4; r3 = c3;
r2 = c2; r1 = zz; r0 = c0; end
  8'b00000011 : begin r7 = c7; r6 = c6; r5 = c1; r4 = c0; r3 = c3;
r2 = c2; r1 = zz; r0 = zz; end
  8'b00000100 : begin r7 = c7; r6 = c6; r5 = c2; r4 = c4; r3 = c3;
r2 = zz; r1 = c1; r0 = c0; end
  8'b00000101 : begin r7 = c7; r6 = c6; r5 = c2; r4 = c0; r3 = c3;
r2 = zz; r1 = c1; r0 = zz; end
  8'b00000110 : begin r7 = c7; r6 = c6; r5 = c1; r4 = c2; r3 = c3;
r2 = zz; r1 = zz; r0 = c0; end
  8'b00000111 : begin r7 = c7; r6 = c6; r5 = c1; r4 = c0; r3 = c2;
r2 = zz; r1 = zz; r0 = zz; end
  8'b00001000 : begin r7 = c7; r6 = c6; r5 = c3; r4 = c4; r3 = zz;
r2 = c2; r1 = c1; r0 = c0; end
  8'b00001001 : begin r7 = c7; r6 = c6; r5 = c3; r4 = c0; r3 = zz;
r2 = c2; r1 = c1; r0 = zz; end
  8'b00001010 : begin r7 = c7; r6 = c6; r5 = c1; r4 = c3; r3 = zz;
r2 = c2; r1 = zz; r0 = c0; end
  8'b00001011 : begin r7 = c7; r6 = c6; r5 = c1; r4 = c0; r3 = zz;
r2 = c2; r1 = zz; r0 = zz; end
  8'b00001100 : begin r7 = c7; r6 = c6; r5 = c2; r4 = c3; r3 = zz;
r2 = zz; r1 = c1; r0 = c0; end
```

-continued

```
8'b00001101 : begin r7 = c7; r6 = c6; r5 = c2; r4 = c0; r3 = zz;
 r2 = zz; r1 = c1; r0 = zz; end
8'b00001110 : begin r7 = c7; r6 = c6; r5 = c1; r4 = c2; r3 = zz;
 r2 = zz; r1 = zz; r0 = c0; end
8'b00001111 : begin r7 = c7; r6 = c6; r5 = c1; r4 = c0; r3 = zz;
 r2 = zz; r1 = zz; r0 = zz; end
8'b00010000 : begin r7 = c7; r6 = c6; r5 = c4; r4 = zz; r3 = c3;
 r2 = c2; r1 = c1; r0 = c0; end
8'b00010001 : begin r7 = c7; r6 = c6; r5 = c0; r4 = zz; r3 = c3;
 r2 = c2; r1 = c1; r0 = zz; end
8'b00010010 : begin r7 = c7; r6 = c6; r5 = c1; r4 = zz; r3 = c3;
 r2 = c2; r1 = zz; r0 = c0; end
8'b00010011 : begin r7 = c7; r6 = c6; r5 = c1; r4 = zz; r3 = c0;
 r2 = c2; r1 = zz; r0 = zz; end
8'b00010100 : begin r7 = c7; r6 = c6; r5 = c2; r4 = zz; r3 = c3;
 r2 = zz; r1 = c1; r0 = c0; end
8'b00010101 : begin r7 = c7; r6 = c6; r5 = c0; r4 = zz; r3 = c2;
 r2 = zz; r1 = c1; r0 = zz; end
8'b00010110 : begin r7 = c7; r6 = c6; r5 = c1; r4 = zz; r3 = c2;
 r2 = zz; r1 = zz; r0 = c0; end
8'b00010111 : begin r7 = c7; r6 = c6; r5 = c1; r4 = zz; r3 = c2;
 r2 = zz; r1 = zz; r0 = zz; end
8'b00011000 : begin r7 = c7; r6 = c6; r5 = c3; r4 = zz; r3 = zz;
 r2 = c2; r1 = c1; r0 = c0; end
8'b00011001 : begin r7 = c7; r6 = c6; r5 = c0; r4 = zz; r3 = zz;
 r2 = c2; r1 = c1; r0 = zz; end
8'b00011010 : begin r7 = c7; r6 = c6; r5 = c1; r4 = zz; r3 = zz;
 r2 = c2; r1 = zz; r0 = c0; end
8'b00011011 : begin r7 = c7; r6 = c6; r5 = c1; r4 = zz; r3 = zz;
 r2 = c2; r1 = zz; r0 = zz; end
8'b00011100 : begin r7 = c7; r6 = c6; r5 = c2; r4 = zz; r3 = zz;
 r2 = zz; r1 = c1; r0 = c0; end
8'b00011101 : begin r7 = c7; r6 = c6; r5 = c2; r4 = zz; r3 = zz;
 r2 = zz; r1 = c1; r0 = zz; end
8'b00011110 : begin r7 = c7; r6 = c6; r5 = c1; r4 = zz; r3 = zz;
 r2 = zz; r1 = zz; r0 = c0; end
8'b00011111 : begin r7 = c7; r6 = c6; r5 = c1; r4 = zz; r3 = zz;
 r2 = zz; r1 = zz; r0 = zz; end
8'b00100000 : begin r7 = c7; r6 = c6; r5 = zz; r4 = c4; r3 = c3;
 r2 = c2; r1 = c1; r0 = c0; end
8'b00100001 : begin r7 = c7; r6 = c6; r5 = zz; r4 = c0; r3 = c3;
 r2 = c2; r1 = c1; r0 = zz; end
8'b00100010 : begin r7 = c7; r6 = c6; r5 = zz; r4 = c1; r3 = c3;
 r2 = c2; r1 = zz; r0 = c0; end
8'b00100011 : begin r7 = c7; r6 = c6; r5 = zz; r4 = c0; r3 = c1;
 r2 = c2; r1 = zz; r0 = zz; end
8'b00100100 : begin r7 = c7; r6 = c6; r5 = zz; r4 = c2; r3 = c3;
 r2 = zz; r1 = c1; r0 = c0; end
8'b00100101 : begin r7 = c7; r6 = c6; r5 = zz; r4 = c0; r3 = c2;
 r2 = zz; r1 = c1; r0 = zz; end
8'b00100110 : begin r7 = c7; r6 = c6; r5 = zz; r4 = c1; r3 = c2;
 r2 = zz; r1 = zz; r0 = c0; end
8'b00100111 : begin r7 = c7; r6 = c6; r5 = zz; r4 = c0; r3 = c2;
 r2 = zz; r1 = zz; r0 = zz; end
8'b00101000 : begin r7 = c7; r6 = c6; r5 = zz; r4 = c3; r3 = zz;
 r2 = c2; r1 = c1; r0 = c0; end
8'b00101001 : begin r7 = c7; r6 = c6; r5 = zz; r4 = c0; r3 = zz;
 r2 = c2; r1 = c1; r0 = zz; end
8'b00101010 : begin r7 = c7; r6 = c6; r5 = zz; r4 = c1; r3 = zz;
 r2 = c2; r1 = zz; r0 = c0; end
8'b00101011 : begin r7 = c7; r6 = c6; r5 = zz; r4 = c0; r3 = zz;
 r2 = c2; r1 = zz; r0 = zz; end
8'b00101100 : begin r7 = c7; r6 = c6; r5 = zz; r4 = c2; r3 = zz;
 r2 = zz; r1 = c1; r0 = c0; end
8'b00101101 : begin r7 = c7; r6 = c6; r5 = zz; r4 = c0; r3 = zz;
 r2 = zz; r1 = c1; r0 = zz; end
8'b00101110 : begin r7 = c7; r6 = c6; r5 = zz; r4 = c1; r3 = zz;
 r2 = zz; r1 = zz; r0 = c0; end
8'b00101111 : begin r7 = c7; r6 = c6; r5 = zz; r4 = c0; r3 = zz;
 r2 = zz; r1 = zz; r0 = zz; end
8'b00110000 : begin r7 = c7; r6 = c6; r5 = zz; r4 = zz; r3 = c3;
 r2 = c2; r1 = c1; r0 = c0; end
8'b00110001 : begin r7 = c7; r6 = c6; r5 = zz; r4 = zz; r3 = c0;
 r2 = c2; r1 = c1; r0 = zz; end
8'b00110010 : begin r7 = c7; r6 = c6; r5 = zz; r4 = zz; r3 = c1;
 r2 = c2; r1 = zz; r0 = c0; end
8'b00110011 : begin r7 = c7; r6 = c6; r5 = zz; r4 = zz; r3 = c0;
 r2 = c2; r1 = zz; r0 = zz; end
8'b00110100 : begin r7 = c7; r6 = c6; r5 = zz; r4 = zz; r3 = c2;
```

-continued

```
        r2 = zz; r1 = c1; r0 = c0; end
    8'b00110101 : begin r7 = c7; r6 = c6; r5 = zz; r4 = zz; r3 = c2;
        r2 = zz; r1 = c1; r0 = zz; end
    8'b00110110 : begin r7 = c7; r6 = c6; r5 = zz; r4 = zz; r3 = c2;
        r2 = zz; r1 = zz; r0 = c0; end
    8'b00110111 : begin r7 = c7; r6 = c6; r5 = zz; r4 = zz; r3 = c2;
        r2 = zz; r1 = zz; r0 = zz; end
    8'b00111000 : begin r7 = c7; r6 = c6; r5 = zz; r4 = zz; r3 = zz;
        r2 = c2; r1 = c1; r0 = c0; end
    8'b00111001 : begin r7 = c7; r6 = c6; r5 = zz; r4 = zz; r3 = zz;
        r2 = c2; r1 = c1; r0 = zz; end
    8'b00111010 : begin r7 = c7; r6 = c6; r5 = zz; r4 = zz; r3 = zz;
        r2 = c2; r1 = zz; r0 = c0; end
    8'b00111011 : begin r7 = c7; r6 = c6; r5 = zz; r4 = zz; r3 = zz;
        r2 = c2; r1 = zz; r0 = zz; end
    8'b00111100 : begin r7 = c7; r6 = c6; r5 = zz; r4 = zz; r3 = zz;
        r2 = zz; r1 = c1; r0 = c0; end
    8'b00111101 : begin r7 = c7; r6 = c6; r5 = zz; r4 = zz; r3 = zz;
        r2 = zz; r1 = c1; r0 = zz; end
    8'b00111110 : begin r7 = c7; r6 = c6; r5 = zz; r4 = zz; r3 = zz;
        r2 = zz; r1 = zz; r0 = c0; end
    8'b00111111 : begin r7 = c7; r6 = c6; r5 = zz; r4 = zz; r3 = zz;
        r2 = zz; r1 = zz; r0 = zz; end
    8'b01000000 : begin r7 = c7; r6 = zz; r5 = c6; r4 = c4; r3 = c3;
        r2 = c2; r1 = c1; r0 = c0; end
    8'b01000001 : begin r7 = c7; r6 = zz; r5 = c6; r4 = c0; r3 = c3;
        r2 = c2; r1 = c1; r0 = zz; end
    8'b01000010 : begin r7 = c7; r6 = zz; r5 = c1; r4 = c6; r3 = c3;
        r2 = c2; r1 = zz; r0 = c0; end
    8'b01000011 : begin r7 = c7; r6 = zz; r5 = c1; r4 = c0; r3 = c6;
        r2 = c2; r1 = zz; r0 = zz; end
    8'b01000100 : begin r7 = c7; r6 = zz; r5 = c2; r4 = c6; r3 = c3;
        r2 = zz; r1 = c1; r0 = c0; end
    8'b01000101 : begin r7 = c7; r6 = zz; r5 = c6; r4 = c0; r3 = c2;
        r2 = zz; r1 = c1; r0 = zz; end
    8'b01000110 : begin r7 = c7; r6 = zz; r5 = c1; r4 = c6; r3 = c2;
        r2 = zz; r1 = zz; r0 = c0; end
    8'b01000111 : begin r7 = c7; r6 = zz; r5 = c1; r4 = c0; r3 = c2;
        r2 = zz; r1 = zz; r0 = zz; end
    8'b01001000 : begin r7 = c7; r6 = zz; r5 = c3; r4 = c6; r3 = zz;
        r2 = c2; r1 = c1; r0 = c0; end
    8'b01001001 : begin r7 = c7; r6 = zz; r5 = c6; r4 = c0; r3 = zz;
        r2 = c2; r1 = c1; r0 = zz; end
    8'b01001010 : begin r7 = c7; r6 = zz; r5 = c1; r4 = c6; r3 = zz;
        r2 = c2; r1 = zz; r0 = c0; end
    8'b01001011 : begin r7 = c7; r6 = zz; r5 = c1; r4 = c0; r3 = zz;
        r2 = c2; r1 = zz; r0 = zz; end
    8'b01001100 : begin r7 = c7; r6 = zz; r5 = c2; r4 = c6; r3 = zz;
        r2 = zz; r1 = c1; r0 = c0; end
    8'b01001101 : begin r7 = c7; r6 = zz; r5 = c2; r4 = c0; r3 = zz;
        r2 = zz; r1 = c1; r0 = zz; end
    8'b01001110 : begin r7 = c7; r6 = zz; r5 = c1; r4 = c6; r3 = zz;
        r2 = zz; r1 = zz; r0 = c0; end
    8'b01001111 : begin r7 = c7; r6 = zz; r5 = c1; r4 = c0; r3 = zz;
        r2 = zz; r1 = zz; r0 = zz; end
    8'b01010000 : begin r7 = c7; r6 = zz; r5 = c6; r4 = zz; r3 = c3;
        r2 = c2; r1 = c1; r0 = c0; end
    8'b01010001 : begin r7 = c7; r6 = zz; r5 = c6; r4 = zz; r3 = c0;
        r2 = c2; r1 = c1; r0 = zz; end
    8'b01010010 : begin r7 = c7; r6 = zz; r5 = c1; r4 = zz; r3 = c6;
        r2 = c2; r1 = zz; r0 = c0; end
    8'b01010011 : begin r7 = c7; r6 = zz; r5 = c1; r4 = zz; r3 = c0;
        r2 = c2; r1 = zz; r0 = zz; end
    8'b01010100 : begin r7 = c7; r6 = zz; r5 = c6; r4 = zz; r3 = c2;
        r2 = zz; r1 = c1; r0 = c0; end
    8'b01010101 : begin r7 = c7; r6 = zz; r5 = c6; r4 = zz; r3 = c2;
        r2 = zz; r1 = c1; r0 = zz; end
    8'b01010110 : begin r7 = c7; r6 = zz; r5 = c1; r4 = zz; r3 = c2;
        r2 = zz; r1 = zz; r0 = c0; end
    8'b01010111 : begin r7 = c7; r6 = zz; r5 = c1; r4 = zz; r3 = c2;
        r2 = zz; r1 = zz; r0 = zz; end
    8'b01011000 : begin r7 = c7; r6 = zz; r5 = c6; r4 = zz; r3 = zz;
        r2 = c2; r1 = c1; r0 = c0; end
    8'b01011001 : begin r7 = c7; r6 = zz; r5 = c6; r4 = zz; r3 = zz;
        r2 = c2; r1 = c1; r0 = zz; end
    8'b01011010 : begin r7 = c7; r6 = zz; r5 = c1; r4 = zz; r3 = zz;
        r2 = c2; r1 = zz; r0 = c0; end
    8'b01011011 : begin r7 = c7; r6 = zz; r5 = c1; r4 = zz; r3 = zz;
        r2 = c2; r1 = zz; r0 = zz; end
```

-continued

```
8'b01011100 : begin r7 = c7; r6 = zz; r5 = c2; r4 = zz; r3 = zz;
  r2 = zz; r1 = c1; r0 = c0; end
8'b01011101 : begin r7 = c7; r6 = zz; r5 = c2; r4 = zz; r3 = zz;
  r2 = zz; r1 = c1; r0 = zz; end
8'b01011110 : begin r7 = c7; r6 = zz; r5 = c1; r4 = zz; r3 = zz;
  r2 = zz; r1 = zz; r0 = c0; end
8'b01011111 : begin r7 = c7; r6 = zz; r5 = c1; r4 = zz; r3 = zz;
  r2 = zz; r1 = zz; r0 = zz; end
8'b01100000 : begin r7 = c7; r6 = zz; r5 = zz; r4 = c6; r3 = c3;
  r2 = c2; r1 = c1; r0 = c0; end
8'b01100001 : begin r7 = c7; r6 = zz; r5 = zz; r4 = c0; r3 = c6;
  r2 = c2; r1 = c1; r0 = zz; end
8'b01100010 : begin r7 = c7; r6 = zz; r5 = zz; r4 = c1; r3 = c6;
  r2 = c2; r1 = zz; r0 = c0; end
8'b01100011 : begin r7 = c7; r6 = zz; r5 = zz; r4 = c0; r3 = c6;
  r2 = c2; r1 = zz; r0 = zz; end
8'b01100100 : begin r7 = c7; r6 = zz; r5 = zz; r4 = c6; r3 = c2;
  r2 = zz; r1 = c1; r0 = c0; end
8'b01100101 : begin r7 = c7; r6 = zz; r5 = zz; r4 = c0; r3 = c2;
  r2 = zz; r1 = c1; r0 = zz; end
8'b01100110 : begin r7 = c7; r6 = zz; r5 = zz; r4 = c1; r3 = c2;
  r2 = zz; r1 = zz; r0 = c0; end
8'b01100111 : begin r7 = c7; r6 = zz; r5 = zz; r4 = c0; r3 = c2;
  r2 = zz; r1 = zz; r0 = zz; end
8'b01101000 : begin r7 = c7; r6 = zz; r5 = zz; r4 = c6; r3 = zz;
  r2 = c2; r1 = c1; r0 = c0; end
8'b01101001 : begin r7 = c7; r6 = zz; r5 = zz; r4 = c0; r3 = zz;
  r2 = c2; r1 = c1; r0 = zz; end
8'b01101010 : begin r7 = c7; r6 = zz; r5 = zz; r4 = c1; r3 = zz;
  r2 = c2; r1 = zz; r0 = c0; end
8'b01101011 : begin r7 = c7; r6 = zz; r5 = zz; r4 = c0; r3 = zz;
  r2 = c2; r1 = zz; r0 = zz; end
8'b01101100 : begin r7 = c7; r6 = zz; r5 = zz; r4 = c6; r3 = zz;
  r2 = zz; r1 = c1; r0 = c0; end
8'b01101101 : begin r7 = c7; r6 = zz; r5 = zz; r4 = c0; r3 = zz;
  r2 = zz; r1 = c1; r0 = zz; end
8'b01101110 : begin r7 = c7; r6 = zz; r5 = zz; r4 = c1; r3 = zz;
  r2 = zz; r1 = zz; r0 = c0; end
8'b01101111 : begin r7 = c7; r6 = zz; r5 = zz; r4 = c0; r3 = zz;
  r2 = zz; r1 = zz; r0 = zz; end
8'b01110000 : begin r7 = c7; r6 = zz; r5 = zz; r4 = zz; r3 = c6;
  r2 = c2; r1 = c1; r0 = c0; end
8'b01110001 : begin r7 = c7; r6 = zz; r5 = zz; r4 = zz; r3 = c0;
  r2 = c2; r1 = c1; r0 = zz; end
8'b01110010 : begin r7 = c7; r6 = zz; r5 = zz; r4 = zz; r3 = c1;
  r2 = c2; r1 = zz; r0 = c0; end
8'b01110011 : begin r7 = c7; r6 = zz; r5 = zz; r4 = zz; r3 = c0;
  r2 = c2; r1 = zz; r0 = zz; end
8'b01110100 : begin r7 = c7; r6 = zz; r5 = zz; r4 = zz; r3 = c2;
  r2 = zz; r1 = c1; r0 = c0; end
8'b01110101 : begin r7 = c7; r6 = zz; r5 = zz; r4 = zz; r3 = c2;
  r2 = zz; r1 = c1; r0 = zz; end
8'b01110110 : begin r7 = c7; r6 = zz; r5 = zz; r4 = zz; r3 = c2;
  r2 = zz; r1 = zz; r0 = c0; end
8'b01110111 : begin r7 = c7; r6 = zz; r5 = zz; r4 = zz; r3 = c2;
  r2 = zz; r1 = zz; r0 = zz; end
8'b01111000 : begin r7 = c7; r6 = zz; r5 = zz; r4 = zz; r3 = zz;
  r2 = c2; r1 = c1; r0 = c0; end
8'b01111001 : begin r7 = c7; r6 = zz; r5 = zz; r4 = zz; r3 = zz;
  r2 = c2; r1 = c1; r0 = zz; end
8'b01111010 : begin r7 = c7; r6 = zz; r5 = zz; r4 = zz; r3 = zz;
  r2 = c2; r1 = zz; r0 = c0; end
8'b01111011 : begin r7 = c7; r6 = zz; r5 = zz; r4 = zz; r3 = zz;
  r2 = c2; r1 = zz; r0 = zz; end
8'b01111100 : begin r7 = c7; r6 = zz; r5 = zz; r4 = zz; r3 = zz;
  r2 = zz; r1 = c1; r0 = c0; end
8'b01111101 : begin r7 = c7; r6 = zz; r5 = zz; r4 = zz; r3 = zz;
  r2 = zz; r1 = c1; r0 = zz; end
8'b01111110 : begin r7 = c7; r6 = zz; r5 = zz; r4 = zz; r3 = zz;
  r2 = zz; r1 = zz; r0 = c0; end
8'b01111111 : begin r7 = c7; r6 = zz; r5 = zz; r4 = zz; r3 = zz;
  r2 = zz; r1 = zz; r0 = zz; end
8'b10000000 : begin r7 = zz; r6 = c6; r5 = c7; r4 = c4; r3 = c3;
  r2 = c2; r1 = c1; r0 = c0; end
8'b10000001 : begin r7 = zz; r6 = c6; r5 = c7; r4 = c0; r3 = c3;
  r2 = c2; r1 = c1; r0 = zz; end
8'b10000010 : begin r7 = zz; r6 = c6; r5 = c1; r4 = c7; r3 = c3;
  r2 = c2; r1 = zz; r0 = c0; end
8'b10000011 : begin r7 = zz; r6 = c6; r5 = c1; r4 = c0; r3 = c7;
```

-continued

```
        r2 = c2; r1 = zz; r0 = zz; end
    8'b10000100 : begin r7 = zz; r6 = c6; r5 = c2; r4 = c7; r3 = c3;
        r2 = r1; r1 = c1; r0 = c0; end
    8'b10000101 : begin r7 = zz; r6 = c6; r5 = c7; r4 = c0; r3 = c2;
        r2 = zz; r1 = c1; r0 = zz; end
    8'b10000110 : begin r7 = zz; r6 = c6; r5 = c1; r4 = c7; r3 = c2;
        r2 = zz; r1 = zz; r0 = c0; end
    8'b10000111 : begin r7 = zz; r6 = c6; r5 = c1; r4 = c0; r3 = c2;
        r2 = zz; r1 = zz; r0 = zz; end
    8'b10001000 : begin r7 = zz; r6 = c6; r5 = c3; r4 = c7; r3 = zz;
        r2 = c2; r1 = c1; r0 = c0; end
    8'b10001001 : begin r7 = zz; r6 = c6; r5 = c7; r4 = c0; r3 = zz;
        r2 = c2; r1 = c1; r0 = zz; end
    8'b10001010 : begin r7 = zz; r6 = c6; r5 = c1; r4 = c7; r3 = zz;
        r2 = c2; r1 = zz; r0 = c0; end
    8'b10001011 : begin r7 = zz; r6 = c6; r5 = c1; r4 = c0; r3 = zz;
        r2 = c2; r1 = zz; r0 = zz; end
    8'b10001100 : begin r7 = zz; r6 = c6; r5 = c2; r4 = c7; r3 = zz;
        r2 = zz; r1 = c1; r0 = c0; end
    8'b10001101 : begin r7 = zz; r6 = c6; r5 = c2; r4 = c0; r3 = zz;
        r2 = zz; r1 = c1; r0 = zz; end
    8'b10001110 : begin r7 = zz; r6 = c6; r5 = c1; r4 = c7; r3 = zz;
        r2 = zz; r1 = zz; r0 = c0; end
    8'b10001111 : begin r7 = zz; r6 = c6; r5 = c1; r4 = c0; r3 = zz;
        r2 = zz; r1 = zz; r0 = zz; end
    8'b10010000 : begin r7 = zz; r6 = c6; r5 = c7; r4 = zz; r3 = c3;
        r2 = c2; r1 = c1; r0 = c0; end
    8'b10010001 : begin r7 = zz; r6 = c6; r5 = c7; r4 = zz; r3 = c0;
        r2 = c2; r1 = c1; r0 = zz; end
    8'b10010010 : begin r7 = zz; r6 = c6; r5 = c1; r4 = zz; r3 = c7;
        r2 = c2; r1 = zz; r0 = c0; end
    8'b10010011 : begin r7 = zz; r6 = c6; r5 = c1; r4 = zz; r3 = c0;
        r2 = c2; r1 = zz; r0 = zz; end
    8'b10010100 : begin r7 = zz; r6 = c6; r5 = c7; r4 = zz; r3 = c2;
        r2 = zz; r1 = c1; r0 = c0; end
    8'b10010101 : begin r7 = zz; r6 = c6; r5 = c7; r4 = zz; r3 = c2;
        r2 = zz; r1 = c1; r0 = zz; end
    8'b10010110 : begin r7 = zz; r6 = c6; r5 = c1; r4 = zz; r3 = c2;
        r2 = zz; r1 = zz; r0 = c0; end
    8'b10010111 : begin r7 = zz; r6 = c6; r5 = c1; r4 = zz; r3 = c2;
        r2 = zz; r1 = zz; r0 = zz; end
    8'b10011000 : begin r7 = zz; r6 = c6; r5 = c7; r4 = zz; r3 = zz;
        r2 = c2; r1 = c1; r0 = c0; end
    8'b10011001 : begin r7 = zz; r6 = c6; r5 = c7; r4 = zz; r3 = zz;
        r2 = c2; r1 = c1; r0 = zz; end
    8'b10011010 : begin r7 = zz; r6 = c6; r5 = c1; r4 = zz; r3 = zz;
        r2 = c2; r1 = zz; r0 = c0; end
    8'b10011011 : begin r7 = zz; r6 = c6; r5 = c1; r4 = zz; r3 = zz;
        r2 = c2; r1 = zz; r0 = zz; end
    8'b10011100 : begin r7 = zz; r6 = c6; r5 = c2; r4 = zz; r3 = zz;
        r2 = zz; r1 = c1; r0 = c0; end
    8'b10011101 : begin r7 = zz; r6 = c6; r5 = c2; r4 = zz; r3 = zz;
        r2 = zz; r1 = c1; r0 = zz; end
    8'b10011110 : begin r7 = zz; r6 = c6; r5 = c1; r4 = zz; r3 = zz;
        r2 = zz; r1 = zz; r0 = c0; end
    8'b10011111 : begin r7 = zz; r6 = c6; r5 = c1; r4 = zz; r3 = zz;
        r2 = zz; r1 = zz; r0 = zz; end
    8'b10100000 : begin r7 = zz; r6 = c6; r5 = zz; r4 = c7; r3 = c3;
        r2 = c2; r1 = c1; r0 = c0; end
    8'b10100001 : begin r7 = zz; r6 = c6; r5 = zz; r4 = c0; r3 = c7;
        r2 = c2; r1 = c1; r0 = zz; end
    8'b10100010 : begin r7 = zz; r6 = c6; r5 = zz; r4 = c1; r3 = c7;
        r2 = c2; r1 = zz; r0 = c0; end
    8'b10100011 : begin r7 = zz; r6 = c6; r5 = zz; r4 = c0; r3 = c7;
        r2 = c2; r1 = zz; r0 = zz; end
    8'b10100100 : begin r7 = zz; r6 = c6; r5 = zz; r4 = c7; r3 = c2;
        r2 = zz; r1 = c1; r0 = c0; end
    8'b10100101 : begin r7 = zz; r6 = c6; r5 = zz; r4 = c0; r3 = c2;
        r2 = zz; r1 = c1; r0 = zz; end
    8'b10100110 : begin r7 = zz; r6 = c6; r5 = zz; r4 = c1; r3 = c2;
        r2 = zz; r1 = zz; r0 = c0; end
    8'b10100111 : begin r7 = zz; r6 = c6; r5 = zz; r4 = c0; r3 = c2;
        r2 = zz; r1 = zz; r0 = zz; end
    8'b10101000 : begin r7 = zz; r6 = c6; r5 = zz; r4 = c7; r3 = zz;
        r2 = c2; r1 = c1; r0 = c0; end
    8'b10101001 : begin r7 = zz; r6 = c6; r5 = zz; r4 = c0; r3 = zz;
        r2 = c2; r1 = c1; r0 = zz; end
    8'b10101010 : begin r7 = zz; r6 = c6; r5 = zz; r4 = c1; r3 = zz;
        r2 = c2; r1 = zz; r0 = c0; end
```

-continued

```
8'b10101011 : begin r7 = zz; r6 = c6; r5 = zz; r4 = c0; r3 = zz;
r2 = c2; r1 = zz; r0 = zz; end
8'b10101100 : begin r7 = zz; r6 = c6; r5 = zz; r4 = c7; r3 = zz;
r2 = zz; r1 = c1; r0 = c0; end
8'b10101101 : begin r7 = zz; r6 = c6; r5 = zz; r4 = c0; r3 = zz;
r2 = zz; r1 = c1; r0 = zz; end
8'b10101110 : begin r7 = zz; r6 = c6; r5 = zz; r4 = c1; r3 = zz;
r2 = zz; r1 = zz; r0 = c0; end
8'b10101111 : begin r7 = zz; r6 = c6; r5 = zz; r4 = c0; r3 = zz;
r2 = zz; r1 = zz; r0 = zz; end
8'b10110000 : begin r7 = zz; r6 = c6; r5 = zz; r4 = zz; r3 = c7;
r2 = c2; r1 = c1; r0 = c0; end
8'b10110001 : begin r7 = zz; r6 = c6; r5 = zz; r4 = zz; r3 = c0;
r2 = c2; r1 = c1; r0 = zz; end
8'b10110010 : begin r7 = zz; r6 = c6; r5 = zz; r4 = zz; r3 = c1;
r2 = c2; r1 = zz; r0 = c0; end
8'b10110011 : begin r7 = zz; r6 = c6; r5 = zz; r4 = zz; r3 = c0;
r2 = c2; r1 = zz; r0 = zz; end
8'b10110100 : begin r7 = zz; r6 = c6; r5 = zz; r4 = zz; r3 = c2;
r2 = zz; r1 = c1; r0 = c0; end
8'b10110101 : begin r7 = zz; r6 = c6; r5 = zz; r4 = zz; r3 = c2;
r2 = zz; r1 = c1; r0 = zz; end
8'b10110110 : begin r7 = zz; r6 = c6; r5 = zz; r4 = zz; r3 = c2;
r2 = zz; r1 = zz; r0 = c0; end
8'b10110111 : begin r7 = zz; r6 = c6; r5 = zz; r4 = zz; r3 = c2;
r2 = zz; r1 = zz; r0 = zz; end
8'b10111000 : begin r7 = zz; r6 = c6; r5 = zz; r4 = zz; r3 = zz;
r2 = c2; r1 = c1; r0 = c0; end
8'b10111001 : begin r7 = zz; r6 = c6; r5 = zz; r4 = zz; r3 = zz;
r2 = c2; r1 = c1; r0 = zz; end
8'b10111010 : begin r7 = zz; r6 = c6; r5 = zz; r4 = zz; r3 = zz;
r2 = c2; r1 = zz; r0 = c0; end
8'b10111011 : begin r7 = zz; r6 = c6; r5 = zz; r4 = zz; r3 = zz;
r2 = c2; r1 = zz; r0 = zz; end
8'b10111100 : begin r7 = zz; r6 = c6; r5 = zz; r4 = zz; r3 = zz;
r2 = zz; r1 = c1; r0 = c0; end
8'b10111101 : begin r7 = zz; r6 = c6; r5 = zz; r4 = zz; r3 = zz;
r2 = zz; r1 = c1; r0 = zz; end
8'b10111110 : begin r7 = zz; r6 = c6; r5 = zz; r4 = zz; r3 = zz;
r2 = zz; r1 = zz; r0 = c0; end
8'b10111111 : begin r7 = zz; r6 = c6; r5 = zz; r4 = zz; r3 = zz;
r2 = zz; r1 = zz; r0 = zz; end
8'b11000000 : begin r7 = zz; r6 = zz; r5 = c7; r4 = c6; r3 = c3;
r2 = c2; r1 = c1; r0 = c0; end
8'b11000001 : begin r7 = zz; r6 = zz; r5 = c7; r4 = c0; r3 = c6;
r2 = c2; r1 = c1; r0 = zz; end
8'b11000010 : begin r7 = zz; r6 = zz; r5 = c1; r4 = c6; r3 = c7;
r2 = c2; r1 = zz; r0 = c0; end
8'b11000011 : begin r7 = zz; r6 = zz; r5 = c1; r4 = c0; r3 = c6;
r2 = c2; r1 = zz; r0 = zz; end
8'b11000100 : begin r7 = zz; r6 = zz; r5 = c7; r4 = c6; r3 = c2;
r2 = zz; r1 = c1; r0 = c0; end
8'b11000101 : begin r7 = zz; r6 = zz; r5 = c7; r4 = c0; r3 = c2;
r2 = zz; r1 = c1; r0 = zz; end
8'b11000110 : begin r7 = zz; r6 = zz; r5 = c1; r4 = c6; r3 = c2;
r2 = zz; r1 = zz; r0 = c0; end
8'b11000111 : begin r7 = zz; r6 = zz; r5 = c1; r4 = c0; r3 = c2;
r2 = zz; r1 = zz; r0 = zz; end
8'b11001000 : begin r7 = zz; r6 = zz; r5 = c7; r4 = c6; r3 = zz;
r2 = c2; r1 = c1; r0 = c0; end
8'b11001001 : begin r7 = zz; r6 = zz; r5 = c7; r4 = c0; r3 = zz;
r2 = c2; r1 = c1; r0 = zz; end
8'b11001010 : begin r7 = zz; r6 = zz; r5 = c1; r4 = c6; r3 = zz;
r2 = c2; r1 = zz; r0 = c0; end
8'b11001011 : begin r7 = zz; r6 = zz; r5 = c1; r4 = c0; r3 = zz;
r2 = c2; r1 = zz; r0 = zz; end
8'b11001100 : begin r7 = zz; r6 = zz; r5 = c2; r4 = c6; r3 = zz;
r2 = zz; r1 = c1; r0 = c0; end
8'b11001101 : begin r7 = zz; r6 = zz; r5 = c2; r4 = c0; r3 = zz;
r2 = zz; r1 = c1; r0 = zz; end
8'b11001110 : begin r7 = zz; r6 = zz; r5 = c1; r4 = c6; r3 = zz;
r2 = zz; r1 = zz; r0 = c0; end
8'b11001111 : begin r7 = zz; r6 = zz; r5 = c1; r4 = c0; r3 = zz;
r2 = zz; r1 = zz; r0 = zz; end
8'b11010000 : begin r7 = zz; r6 = zz; r5 = c7; r4 = zz; r3 = c6;
r2 = c2; r1 = c1; r0 = c0; end
8'b11010001 : begin r7 = zz; r6 = zz; r5 = c7; r4 = zz; r3 = c0;
r2 = c2; r1 = c1; r0 = zz; end
8'b11010010 : begin r7 = zz; r6 = zz; r5 = c1; r4 = zz; r3 = c6;
```

-continued

```
         r2 = c2; r1 = zz; r0 = c0; end
   8'b11010011 : begin r7 = zz; r6 = zz; r5 = c1; r4 = zz; r3 = c0;
         r2 = c2; r1 = zz; r0 = zz; end
   8'b11010100 : begin r7 = zz; r6 = zz; r5 = c7; r4 = zz; r3 = c2;
         r2 = zz; r1 = c1; r0 = c0; end
   8'b11010101 : begin r7 = zz; r6 = zz; r5 = c7; r4 = zz; r3 = c2;
         r2 = zz; r1 = c1; r0 = zz; end
   8'b11010110 : begin r7 = zz; r6 = zz; r5 = c1; r4 = zz; r3 = c2;
         r2 = zz; r1 = zz; r0 = c0; end
   8'b11010111 : begin r7 = zz; r6 = zz; r5 = c1; r4 = zz; r3 = c2;
         r2 = zz; r1 = zz; r0 = zz; end
   8'b11011000 : begin r7 = zz; r6 = zz; r5 = c7; r4 = zz; r3 = zz;
         r2 = c2; r1 = c1; r0 = c0; end
   8'b11011001 : begin r7 = zz; r6 = zz; r5 = c7; r4 = zz; r3 = zz;
         r2 = c2; r1 = c1; r0 = zz; end
   8'b11011010 : begin r7 = zz; r6 = zz; r5 = c1; r4 = zz; r3 = zz;
         r2 = c2; r1 = zz; r0 = c0; end
   8'b11011011 : begin r7 = zz; r6 = zz; r5 = c1; r4 = zz; r3 = zz;
         r2 = c2; r1 = zz; r0 = zz; end
   8'b11011100 : begin r7 = zz; r6 = zz; r5 = c2; r4 = zz; r3 = zz;
         r2 = zz; r1 = c1; r0 = c0; end
   8'b11011101 : begin r7 = zz; r6 = zz; r5 = c2; r4 = zz; r3 = zz;
         r2 = zz; r1 = c1; r0 = zz; end
   8'b11011110 : begin r7 = zz; r6 = zz; r5 = c1; r4 = zz; r3 = zz;
         r2 = zz; r1 = zz; r0 = c0; end
   8'b11011111 : begin r7 = zz; r6 = zz; r5 = c1; r4 = zz; r3 = zz;
         r2 = zz; r1 = zz; r0 = zz; end
   8'b11100000 : begin r7 = zz; r6 = zz; r5 = zz; r4 = c6; r3 = c7;
         r2 = c2; r1 = c1; r0 = c0; end
   8'b11100001 : begin r7 = zz; r6 = zz; r5 = zz; r4 = c0; r3 = c7;
         r2 = c2; r1 = c1; r0 = zz; end
   8'b11100010 : begin r7 = zz; r6 = zz; r5 = zz; r4 = c1; r3 = c7;
         r2 = c2; r1 = zz; r0 = c0; end
   8'b11100011 : begin r7 = zz; r6 = zz; r5 = zz; r4 = c0; r3 = c6;
         r2 = c2; r1 = zz; r0 = zz; end
   8'b11100100 : begin r7 = zz; r6 = zz; r5 = zz; r4 = c6; r3 = c2;
         r2 = zz; r1 = c1; r0 = c0; end
   8'b11100101 : begin r7 = zz; r6 = zz; r5 = zz; r4 = c0; r3 = c2;
         r2 = zz; r1 = c1; r0 = zz; end
   8'b11100110 : begin r7 = zz; r6 = zz; r5 = zz; r4 = c1; r3 = c2;
         r2 = zz; r1 = zz; r0 = c0; end
   8'b11100111 : begin r7 = zz; r6 = zz; r5 = zz; r4 = c0; r3 = c2;
         r2 = zz; r1 = zz; r0 = zz; end
   8'b11101000 : begin r7 = zz; r6 = zz; r5 = zz; r4 = c6; r3 = zz;
         r2 = c2; r1 = c1; r0 = c0; end
   8'b11101001 : begin r7 = zz; r6 = zz; r5 = zz; r4 = c0; r3 = zz;
         r2 = c2; r1 = c1; r0 = zz; end
   8'b11101010 : begin r7 = zz; r6 = zz; r5 = zz; r4 = c1; r3 = zz;
         r2 = c2; r1 = zz; r0 = c0; end
   8'b11101011 : begin r7 = zz; r6 = zz; r5 = zz; r4 = c0; r3 = zz;
         r2 = c2; r1 = zz; r0 = zz; end
   8'b11101100 : begin r7 = zz; r6 = zz; r5 = zz; r4 = c6; r3 = zz;
         r2 = zz; r1 = c1; r0 = zz; end
   8'b11101101 : begin r7 = zz; r6 = zz; r5 = zz; r4 = c0; r3 = zz;
         r2 = zz; r1 = c1; r0 = zz; end
   8'b11101110 : begin r7 = zz; r6 = zz; r5 = zz; r4 = c1; r3 = zz;
         r2 = zz; r1 = zz; r0 = c0; end
   8'b11101111 : begin r7 = zz; r6 = zz; r5 = zz; r4 = c0; r3 = zz;
         r2 = zz; r1 = zz; r0 = zz; end
   8'b11110000 : begin r7 = zz; r6 = zz; r5 = zz; r4 = zz; r3 = c6;
         r2 = c2; r1 = c1; r0 = c0; end
   8'b11110001 : begin r7 = zz; r6 = zz; r5 = zz; r4 = zz; r3 = c0;
         r2 = c2; r1 = c1; r0 = zz; end
   8'b11110010 : begin r7 = zz; r6 = zz; r5 = zz; r4 = zz; r3 = c1;
         r2 = c2; r1 = zz; r0 = c0; end
   8'b11110011 : begin r7 = zz; r6 = zz; r5 = zz; r4 = zz; r3 = c0;
         r2 = c2; r1 = zz; r0 = zz; end
   8'b11110100 : begin r7 = zz; r6 = zz; r5 = zz; r4 = zz; r3 = c2;
         r2 = zz; r1 = c1; r0 = c0; end
   8'b11110101 : begin r7 = zz; r6 = zz; r5 = zz; r4 = zz; r3 = c2;
         r2 = zz; r1 = c1; r0 = zz; end
   8'b11110110 : begin r7 = zz; r6 = zz; r5 = zz; r4 = zz; r3 = c2;
         r2 = zz; r1 = zz; r0 = c0; end
   8'b11110111 : begin r7 = zz; r6 = zz; r5 = zz; r4 = zz; r3 = c2;
         r2 = zz; r1 = zz; r0 = zz; end
   8'b11111000 : begin r7 = zz; r6 = zz; r5 = zz; r4 = zz; r3 = zz;
         r2 = c2; r1 = c1; r0 = c0; end
   8'b11111001 : begin r7 = zz; r6 = zz; r5 = zz; r4 = zz; r3 = zz;
         r2 = c2; r1 = c1; r0 = zz; end
```

-continued

```
    8'b11111010 : begin r7 = zz; r6 = zz; r5 = zz; r4 = zz; r3 = zz;
r2 = c2; r1 = zz; r0 = c0; end
    8'b11111011 : begin r7 = zz; r6 = zz; r5 = zz; r4 = zz; r3 = zz;
r2 = c2; r1 = zz; r0 = zz; end
    8'b11111100 : begin r7 = zz; r6 = zz; r5 = zz; r4 = zz; r3 = zz;
r2 = zz; r1 = c1; r0 = c0; end
    8'b11111101 : begin r7 = zz; r6 = zz; r5 = zz; r4 = zz; r3 = zz;
r2 = zz; r1 = c1; r0 = zz; end
    8'b11111110 : begin r7 = zz; r6 = zz; r5 = zz; r4 = zz; r3 = zz;
r2 = zz; r1 = zz; r0 = c0; end
    8'b11111111 : begin r7 = zz; r6 = zz; r5 = zz; r4 = zz; r3 = zz;
r2 = zz; r1 = zz; r0 = zz; end
    endcase
end
endmodule
```

Having thus described an embodiment of the invention, it will now be appreciated that the objects of the invention have been fully achieved, and it will be understood by those skilled in the art that many changes in construction and widely differing embodiments and applications of the invention will suggest themselves without departing from the spirit and scope of the invention. The disclosure and the description herein are purely illustrative and are not intended to be in any sense limiting.

What is claimed is:

1. Within a magnetic recording channel, a method for encoding a sequence of 32-bit digital data words into a sequence of 33-bit code words in accordance with predetermined minimum zero run length (d) and predetermined maximum zero run length (k) for recording upon a magnetic data storage medium, comprising the steps of:

dividing a present 32-bit digital data word into eight four-bit data sub-words, determining whether any of the eight four-bit sub-words are composed entirely of zeros as a code violation, generating a 33-bit code word corresponding to the present 32-bit digital data word by forming eight code sub-words, wherein a first code sub-word at a predetermined location is provided with a fifth bit as a first control bit, and wherein each data sub-word not containing a code violation is mapped unchanged to a code sub-word, and wherein any data sub-word found to contain a code violation is identified by the fifth control bit and by other predefined bit positions of the code word such that the 33-bit code word has a maximum zero run length (k) not exceeding six.

2. The method set forth in claim 1 wherein the fifth bit is located at a least significant bit position of the first code sub-word.

3. The method set forth in claim 1 wherein the first control bit is set to one if all of the data sub-words are determined not to contain a code violation.

4. The method set forth in claim 1 wherein a single data sub-word is determined to contain a code violation, comprising the further steps of setting the first control bit to a first logical state and a second control bit defined within the first control sub-word to a second logical state, and using the remaining three bits of the first code sub-word to identify the single data sub-word containing the code violation, and relocating a data sub-word otherwise mapping to the first code sub-word to a code sub-word to which the data sub-word having the code violation otherwise would be mapped in absence of a code violation.

5. The method set forth in claim 1 wherein two data sub-words are determined each to contain a code violation, comprising the further steps of setting the first control bit, and a second control bit of the first code sub-word to a first logical state, and setting a third control bit within a second code sub-word to a second logical state, setting the remaining three bits of the first code sub-word to identify one of the two data sub-words containing a code violation within a first predetermined range of data sub-words, and setting the remaining three bits of the second code sub-word to identify the other of the two data sub-words containing a code violation within a second predetermined range of data sub-words, relocating a data sub-word otherwise mapping to the first code sub-word to a code sub-word otherwise receiving the data code sub-word identified by the first code sub-word to contain a code violation, and relocating a data sub-word otherwise mapping to the second code sub-word to a code sub-word otherwise receiving the data code sub-word identified by the second code sub-word to contain a code violation.

6. The method set forth in claim 4 wherein the first logical state is logical zero, and wherein the second logical state is logical one.

7. The method set forth in claim 5 wherein the first logical state is logical zero, and wherein the second logical state is logical one.

8. The method set forth in claim 1 comprising the further step of generating an eight-bit flag wherein each bit position of the flag identifies a sub-word having a code violation, and wherein the step of generating a 33-bit code word includes embedding the eight-bit flag therewithin in the event that three or more code violations are found to be present in the 32-bit digital data word.

9. The method set forth in claim 8 wherein the first code sub-word, a second code sub-word and a third code sub-word have predetermined bit positions into which the eight-bit flag is written.

10. The method set forth in claim 9 wherein a fourth code sub-word is written to an all one pattern to provide maximum timing information for a timing loop of the magnetic recording channel.

11. The method set forth in claim 1 wherein the first code sub-word is centrally located within the 33-bit code word.

12. A method for generating a (d=0, k=6) rate 32/33 channel code for use in a partial response, sampling data detection channel to encode a series of 32-bit user digital data words, the method comprising the steps of:

dividing each 32-bit user data word into eight four-bit data nibbles, determining whether any of the data nibbles contain all zeros, if not, mapping the eight four-bit data nibbles to seven four-bit code nibbles and one five-bit code sub-word, and setting a fifth bit of the code sub-word to one, and if so, embedding location of a code violation within at least the five-bit code sub-word, and mapping a data nibble otherwise mapping to the sub-word to a code nibble otherwise receiving the data nibble determined to have a code violation.

13. The method set forth in claim 12 wherein the data detection channel is included within a multi-channel digital linear tape recording system.

14. A method for generating a (d=0, k=6) rate 32/33 channel code for a partial response, sampling data detection channel to encode a series of user digital data bits, comprising the steps of:

forming a sequence of 32-bit user data words, dividing each 32-bit user data word into eight four-bit data nibbles, determining whether any of the data nibbles contain all zeros, if no data nibbles are found to contain all zeros, then mapping the eight four-bit data nibbles to seven four-bit code nibbles and one five-bit code sub-word, and setting a first control bit of the code sub-word, comprising a fifth bit position thereof, to one, else if a single data nibble is determined to contain all zeros as a code violation, then embedding location of the code violation within at least the five-bit code sub-word, and mapping a data nibble otherwise mapping to the five-bit code sub-word to a code nibble otherwise receiving the data nibble determined to have a code violation, else if two data nibbles are determined to contain all zeros, then setting the first control bit to zero, setting a second control bit of the code sub-word to zero, and setting a third control bit within a second code sub-word to one, setting the remaining three bits of the first code sub-word to identify one of the two data nibbles containing all zeros within a first predetermined range of data nibbles, and setting the remaining three bits of the second code sub-word to identify the other of the two data nibbles containing all zeros within a second predetermined range of data nibbles, relocating a data nibble otherwise mapping to the first code sub-word to a code sub-word otherwise receiving the data nibble identified by the first code sub-word to contain all zeros, and relocating a data nibble otherwise mapping to the second code sub-word to a code sub-word otherwise receiving the data nibble identified by the second code sub-word to contain all zeros, else if three or more data nibbles are determined to contain all zeros, then generating an eight-bit flag wherein each bit position of the flag identifies a data nibble determined to contain all zeros, and writing the eight bit flag into predetermined control bit positions defined in the first code sub-word, the second code-sub word, and a third code sub-word.

15. The method set forth in claim 14 wherein if three or more data nibbles are determined to contain all zeros, the resulting step also includes the step of writing a fourth code sub-word to all ones to provide maximum timing information for a timing loop within the partial response, sampling data detection channel.

16. The method set forth in claim 14 wherein the partial response, sampling data detection channel is within a multi-channel linear digital magnetic tape recording/playback system.

17. A modulation encoder for a multi-channel magnetic recording system having an interface to a host computing system, a block buffer memory having a predetermined data word size not less than 32 bits, a control microprocessor, and a system bus having the predetermined data word size, the modulation encoder having an incoming user data word size corresponding to the predetermined data word size and an output code word size equal to the predetermined data word size plus one bit, and wherein the modulation encoder encodes each incoming user data word into a corresponding code word having a minimum zero run length equal to zero (d=0) and a maximum zero run length equal to six (k=6).

18. The modulation encoder set forth in claim 17 wherein the modulation encoder includes first means for dividing each user data word into an integer number of four-bit data nibbles, second means responsive to the first means for determining whether any of the data nibbles contain all zeros, and third means responsive to the second means for mapping, in the absence of any data nibble containing all zeros, the integer number of four-bit data nibbles to a one-less integer number of four-bit code nibbles and one five-bit code sub-word, and setting a fifth bit of the code sub-word to one, and in the presence of a data nibble containing all zeros, for mapping a location of said data nibble containing all zeros to at least the five-bit code sub-word, and mapping a data nibble otherwise mapping to the five-bit code sub-word to a code nibble otherwise receiving the data nibble determined to have a code violation, and setting the fifth-bit of the five-bit code sub-word to zero.

19. The modulation encoder set forth in claim 17 wherein the predetermined data word size is 32 bits.

20. The modulation encoder set forth in claim 17 wherein the predetermined data word size is 64 bits.

21. The modulation encoder set forth in claim 17 wherein the multi-channel magnetic recording system comprises a twelve-channel linear digital tape recording and playback system.

* * * * *